United States Patent
Zheng et al.

(10) Patent No.: US 11,842,250 B2
(45) Date of Patent: Dec. 12, 2023

(54) QUANTUM ERROR CORRECTION DECODING SYSTEM AND METHOD, FAULT-TOLERANT QUANTUM ERROR CORRECTION SYSTEM, AND CHIP

(71) Applicant: TENCENT TECHNOLOGY (SHENZHEN) COMPANY LIMITED, Shenzhen (CN)

(72) Inventors: Yicong Zheng, Shenzhen (CN); Guanglei Xi, Shenzhen (CN); Mengyu Zhang, Shenzhen (CN); Hualiang Zhang, Shenzhen (CN); Fuming Liu, Shenzhen (CN); Shengyu Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 119 days.

(21) Appl. No.: 17/666,226

(22) Filed: Feb. 7, 2022

(65) Prior Publication Data
US 2022/0253742 A1    Aug. 11, 2022

Related U.S. Application Data

(63) Continuation of application No. PCT/CN2021/117490, filed on Sep. 9, 2021.

(30) Foreign Application Priority Data

Feb. 7, 2021   (CN) .......................... 202110168322.7

(51) Int. Cl.
| G06N 10/70 | (2022.01) |
| G06F 7/544 | (2006.01) |
| G06N 3/04 | (2023.01) |

(52) U.S. Cl.
CPC ........... *G06N 10/70* (2022.01); *G06F 7/5443* (2013.01); *G06N 3/04* (2013.01)

(58) Field of Classification Search
CPC ............ G06N 10/70; G06N 3/08; G06N 3/04; H03M 13/47; G06F 11/10; G06F 7/5443
See application file for complete search history.

(56) References Cited

U.S. PATENT DOCUMENTS

| 2019/0044542 A1 | 2/2019 | Hogaboam et al. |
| 2019/0179795 A1 | 6/2019 | Huang et al. |

(Continued)

FOREIGN PATENT DOCUMENTS

| CN | 108650029 A | 10/2018 |
| CN | 111510157 A | 8/2020 |

(Continued)

OTHER PUBLICATIONS

Chinni et al., Neural Decoder for Topological codes using pseudo-inverse of parity check matrix, IEEE Information Theory Workshop, pp. 1 to 5. (Year: 2019).*

(Continued)

*Primary Examiner* — Shelly A Chase
(74) *Attorney, Agent, or Firm* — ANOVA LAW GROUP, PLLC

(57) ABSTRACT

A quantum error correction (QEC) decoding system includes an error correction chip. The error correction chip is configured to: obtain error syndrome information of a quantum circuit; and decode the error syndrome information by running neural network decoders, to obtain error result information, a core operation of the neural network decoders being a multiply accumulate (MA) operation of unsigned fixed-point numbers obtained through numerical quantization. According to the present disclosure, for the system that uses the neural network decoders for QEC decoding, the (Continued)

core operation of the neural network decoders is the MA operation of unsigned fixed-point numbers obtained through numerical quantization, thereby minimizing the data volume and the calculation amount desirable by the neural network decoders, so as to better meet the requirement of real-time error correction.

20 Claims, 20 Drawing Sheets

(56) References Cited

U.S. PATENT DOCUMENTS

| | | | |
|---|---|---|---|
| 2020/0257930 | A1 | 8/2020 | Nahr |
| 2020/0310908 | A1 | 10/2020 | Hogaboam |
| 2021/0209470 | A1 | 7/2021 | Sasagawa |
| 2021/0391873 | A1 | 12/2021 | Zheng et al. |
| 2021/0399743 | A1 | 12/2021 | Zheng et al. |

FOREIGN PATENT DOCUMENTS

| | | |
|---|---|---|
| CN | 111510158 A | 8/2020 |
| CN | 112988451 A | 6/2021 |
| WO | 2020065874 A1 | 4/2020 |
| WO | 2021008796 A1 | 1/2021 |

OTHER PUBLICATIONS

Varsamopoulos et al., Comparing Neural network based decoders for the surface code, IEEE Trans. on Computers, vol. 69, No. 2, pp. 300 to 311. (Year: 2020).*

Barbosa de Brito et al., Quantum communications with polarization-encoded qubit using quantum error correction, IEEE Journal of Quantum electronics, vol. 44, No. 2, 2008, pp. 113 to 117. (Year: 2008).*

The Japan Patent Office (JPO) Notification of Reasons for Refusal for Application No. 2022-514800 and Translation dated May 24, 2023 6 Pages.

The State Intellectual Property Office of the People's Republic of China (SIPO) Office Action 1 for for 202110168322.7 dated Dec. 23, 2021 11 Pages (including translation).

The World Intellectual Property Organization (WIPO) International Search Report for PCT/CN2021/117490 dated Dec. 8, 2021 8 Pages (including translation).

Michael A. Nielsen et al., "Quantum Computation and Quantum Information 10th Anniversary Edition," Cambridge University Press, Cambridge, 2010. 698 pages.

D. Lidar et al., "Quantum Error Correction," Cambridge University Press, Cambridge, 2013. 679 pages.

A. G. Fowler et al., "Surface codes: Towards practical large-scale quantum computation," Phys. Rev. A 86, 032324, 2012. 48 pages.

E. Dennis et al., "Topological quantum memory," Phys. 43, No. 9, pp. 4452-4505, 2002. 54 pages.

S. Varsamopoulos et al., "Decoding Small Surface Codes with Feedforward Neural Networks," arXiv:1705.00857v1 [quant-ph], May 2, 2017. 13 pages.

C. Chamberland et al., "Deep neural decoders for near term fault-tolerant experiments," arXiv:1802.06441v1 [quant-ph], Feb. 18, 2018. 26 pages.

S. Varsamopoulos et al., "Decoding surface code with a distributed neural network based decoder," arXiv:1901.10847v2 [quant-ph], Feb. 6, 2019. 10 pages.

P. Baireuther et al., "Neural network decoder for topological color codes with circuit level noise," New J. Phys. 21013003, 2019. 12 pages.

Ryan Sweke et al., "Reinforcement learning decoders for fault-tolerant quantum computation," arXiv preprint arXiv:1810.07207v1 [quant-ph], Oct. 16, 2018. 15 pages.

* cited by examiner

QUANTUM ERROR CORRECTION DECODING SYSTEM AND METHOD, FAULT-TOLERANT QUANTUM ERROR CORRECTION SYSTEM, AND CHIP

RELATED APPLICATION(S)

This application is a continuation application of PCT Patent Application No. PCT/CN2021/117490 filed on Sep. 9, 2021, which claims priority to Chinese Patent Application No. 202110168322.7, entitled "QUANTUM ERROR CORRECTION DECODING SYSTEM AND METHOD, FAULT-TOLERANT QUANTUM ERROR CORRECTION SYSTEM, AND CHIP" filed on Feb. 7, 2021, all of which are incorporated herein by reference in entirety.

FIELD OF THE TECHNOLOGY

The present disclosure relates to the field of quantum technologies, and in particular, to a quantum error correction (QEC) decoding system and method, a fault-tolerant quantum error correction (FTQEC) system, and a chip.

BACKGROUND

Qubits are susceptible to noise. With existing technologies, it may still not be practical to directly implement quantum computation (QC) on physical qubits. Certain development in QEC code technology and fault-tolerant quantum computation (FTQC) technology has been applied to implement QC of arbitrary precision on qubits.

If only quantum information is stored, error syndromes may be detected and collected, and finally error correction is performed according to syndrome information. This error correction manner is referred to as processing or post-processing. However, when FTQC is performed, a quantum circuit changes an error type in real time, and errors occurring in different time and space cannot be correctly tracked and located based on only syndrome information. To enable QC to be performed smoothly, it is desirable to perform decoding immediately after error syndromes are obtained and to perform the error correction before each computation step of a quantum algorithm is run (or before a next round of error correction is started). This error correction manner is referred to as real-time error correction, which is a technology often employed for implementing large-scale general QC.

Real-time error correction often has a requirement on the running time margin of a QEC decoding system, but certain if not all existing designs for QEC decoding systems cannot meet the requirement of real-time error correction.

SUMMARY

Embodiments of the present disclosure provide a quantum error correction (QEC) decoding system and method, a fault-tolerant quantum error correction (FTQEC) system, and a chip, to shorten a time desirable for QEC decoding, thereby meeting the requirement of real-time error correction. The technical solutions are as follows.

In one aspect, the present disclosure, a QEC decoding system is provided, including an error correction chip, where the error correction chip is configured to: obtain error syndrome information of a quantum circuit, the error syndrome information being a data array formed by eigenvalues of a stabilizer generator of a QEC code; and decode the error syndrome information by running neural network decoders, to obtain error result information, the error result information being used for determining a qubit in which an error occurs in the quantum circuit and a corresponding error type, and a core operation of the neural network decoders being a multiply accumulate (MA) operation of unsigned fixed-point numbers obtained through numerical quantization.

In another aspect, the present disclosure provides an FTQEC system, where the FTQEC system includes: a quantum circuit, a quantum control processor (QCP), an arbitrary waveform generator (AWG), a digital acquisition (DAQ) unit, and a QEC decoding system including an error correction chip, the AWG being configured to transmit a measurement waveform for error syndrome measurement to the quantum circuit, the DAQ unit being configured to acquire the measurement waveform amplified by the quantum circuit, demodulate the acquired measurement waveform to obtain error syndrome information of the quantum circuit, and transmit the error syndrome information to the QCP, the error syndrome information being a data array formed by eigenvalues of a stabilizer generator of a QEC code; the QCP being configured to transmit the error syndrome information to the plurality of error correction chips in the QEC decoding system; and the error correction chip being configured to decode the error syndrome information by running neural network decoders, to obtain error result information, the error result information being used for determining a qubit in which an error occurs in the quantum circuit and a corresponding error type, and a core operation of the neural network decoders being a MA operation of unsigned fixed-point numbers obtained through numerical quantization.

In yet another aspect, the present disclosure provides a QEC decoding method applied to a QEC decoding system, the QEC decoding system including an error correction chip, where the QEC decoding method includes: obtaining error syndrome information of a quantum circuit, the error syndrome information being a data array formed by eigenvalues of a stabilizer generator of a QEC code; and decoding the error syndrome information by running neural network decoders, to obtain error result information, the error result information being used for determining a qubit in which an error occurs in the quantum circuit and a corresponding error type, and a core operation of the neural network decoders being a MA operation of unsigned fixed-point numbers obtained through numerical quantization.

In yet another aspect, the present disclosure provides an error correction chip, the error correction chip being configured to implement the QEC decoding method.

In yet another aspect of the present disclosure, a non-transitory computer-readable storage medium is provided, storing at least one computer program, the at least one computer program being loaded and executed by a processor to cause a computer to implement the QEC decoding method.

The technical solutions provided in the embodiments of the present disclosure include at least the following beneficial effects:

For the system that uses the neural network decoders for QEC decoding, the core operation of the neural network decoders is the MA operation of unsigned fixed-point numbers obtained through numerical quantization, thereby minimizing the data volume and the calculation amount desirable by the neural network decoders, so as to better meet the requirement of real-time error correction.

BRIEF DESCRIPTION OF THE DRAWINGS

To facilitate a better understanding of technical solutions of certain embodiments of the present disclosure, accompanying drawings are described below. The accompanying drawings are illustrative of certain embodiments of the present disclosure, and a person of ordinary skill in the art may still derive other drawings from these accompanying drawings without having to exert creative efforts. When the following descriptions are made with reference to the accompanying drawings, unless otherwise indicated, same numbers in different accompanying drawings may represent same or similar elements. In addition, the accompanying drawings are not necessarily drawn to scale.

DETAILED DESCRIPTION

To make objectives, technical solutions, and/or advantages of the present disclosure more comprehensible, certain embodiments of the present disclosure are further elaborated in detail with reference to the accompanying drawings. The embodiments as described are not to be construed as a limitation to the present disclosure. All other embodiments obtained by a person of ordinary skill in the art without creative efforts shall fall within the protection scope of embodiments of the present disclosure.

Throughout the description, and when applicable, "some embodiments" or "certain embodiments" describe subsets of all possible embodiments, but it may be understood that the "some embodiments" or "certain embodiments" may be the same subset or different subsets of all the possible embodiments, and can be combined with each other without conflict.

In certain embodiments, the term "based on" is employed herein interchangeably with the term "according to."

Before embodiments of the present disclosure are described, some terms involved in the present disclosure are explained first.

1. Quantum computation (QC): QC is a scheme of using superposition and entanglement properties of quantum states to rapidly perform a specific computation task.

2. Quantum error correction (QEC): QEC is a scheme of mapping a quantum state to a subspace in the Hilbert space of a many-body quantum system for encoding. Quantum noise may cause an encoded quantum state to be transferred to another subspace. By observing a space in which a quantum state is located (syndrome extraction), quantum noise can be evaluated and corrected without interfering with the encoded quantum state, to protect the encoded quantum state against interference from the quantum noise. In certain embodiment(s), for a QEC code [[n, k, d]], it represents that k (k is a positive integer) logical qubits in n (n is a positive integer) physical qubits are encoded, to correct any $\lfloor (d-1)/2 \rfloor$ (d is a positive integer) errors that occur on any single qubit.

3. Data quantum state: A data quantum state is a quantum state used for storing a data qubit of quantum information during QC.

4. Stabilizer generator: A stabilizer generator is also referred to as a parity check operator. Occurrence of quantum noise (an error) changes eigenvalues of some stabilizer generators, so that QEC can be performed according to the information.

Figure 1:
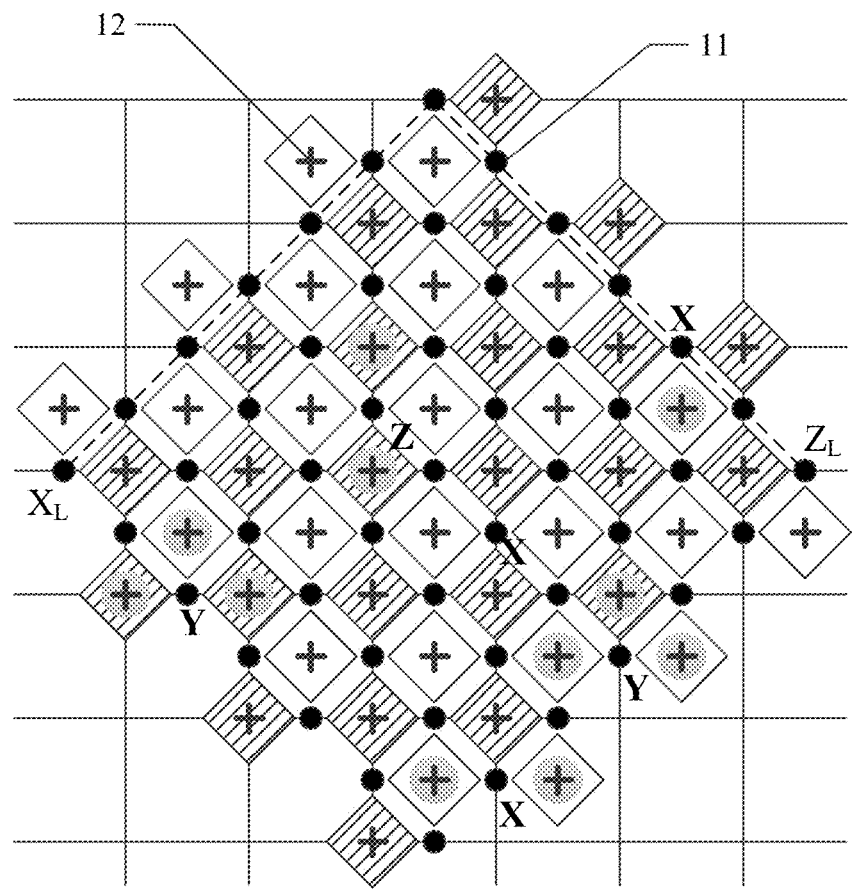
FIG. 1 is a schematic exemplary diagram of a rotated surface code according to certain embodiment(s) of the present disclosure.

5. Error syndrome: When there is no error, eigenvalues of stabilizer generators are 0; and when quantum noise occurs, eigenvalues of stabilizer generators (parity check operators) of some error correction codes change into 1. Bit strings formed by these syndrome bits of 0 and 1 are referred to as error syndromes.
6. Syndrome measurement circuit: A syndrome measurement circuit is also referred to as a check circuit, and is a quantum circuit for obtaining an error syndrome. Generally, the circuit is contaminated with noise.
7. Topological QEC code: A topological QEC code is a special class in a QEC code. Qubits of this class of error correction codes are distributed on a grid array with a dimension greater than or equal to 2. Grids form a discrete structure of a high-dimensional manifold (lattice manifold). In this embodiment, stabilizer generators of the error correction codes are defined on a limited quantity of geometrically neighboring qubits, and therefore, are geometrically adjacent (limited to a small range) and easy to measure. Qubits on which logical operators of this class of correction codes act form a class of geometric objects with non-trivial topologies on a manifold of the grid array.
8. Surface code: A surface code belongs to a class of topological QEC codes defined on a two-dimensional lattice manifold. A stabilizer generator of the surface code is generally supported by four qubits (supported by two qubits at a boundary), and a logical operator of the surface code is a non-trivial chain of a strip-shaped spanning array. A specific two-dimensional structure of the surface code (5×5, which has 49 data qubits and 48 auxiliary qubits in total, and can correct any errors occurring on any two qubits) is shown in FIG. 1: black dots 11 represent the data qubits used for QC, and crosses 12 represent the auxiliary qubits. The auxiliary qubits are initially prepared in a |0⟩ or |+⟩ state. Squares (or semicircles) filled with slashes and squares (or semicircles) filled with white represent two different types of stabilizer generators, which are respectively configured to detect a Z error and an X error. In the present disclosure, a rotated surface code shown in FIG. 1 is used because the rotated surface code can save approximately half of physical qubits, and is more conveniently verified in recent experiments. Parity check operators of this surface code connect four data qubits in the "body" and connect two data qubits at the boundary.
9. Surface code scale L: A surface code scale L is a quarter of a perimeter of a surface code array. A surface code array L=7 in FIG. 1 means that errors that occur on any three qubits can be corrected.
10. Homology class: In a topology, a homology class in a homology theory is represented by a finite linear combination of geometric objects having a boundary of 0. If geometric objects of the linear combination can be considered as boundaries of geometric objects with a dimension greater than 1, it is considered that the linear combination is homologous to "0" (0 herein refers to a trivial class in the topological sense, which is geometric objects that can be contracted to points). In the following, the homology class sometimes is mixed with an "error class".
11. X and Z errors: An X error and a Z error are a Pauli-X evolution error and a Pauli-Z evolution error that are generated on a quantum state of a physical qubit. According to the QEC theory, provided that an error correction code can be used to correct an X error and a Z error, the error correction code can be used to correct any error that occurs on a single qubit.
12. Fault-tolerant quantum error correction (FTQEC): During real QC, noise is present in operation process, including a quantum gate operation and quantum measurement. That is, noise is present even in a circuit for QEC. FTQEC means that an error correction circuit with noise can be used for correction by designing the error correction circuit, and can still achieve the objectives of correcting an error and preventing the error from propagating over time.
13. Fault-tolerant quantum computation (FTQC): FTQC is QC under QEC protection. During QC, noise may be present in any physical operation, including an operation on a QEC circuit itself and qubit measurement. Assuming that classical calculations and operations (such as instruction input and error correction code decoding) are noise-free and may be executed quickly, FTQC is a technical solution of properly designing a QEC scheme and performing a quantum gate operation in a specific manner on an encoded logical quantum state to ensure effective control and error correction during QC using qubits with noise.
14. Real time feedback QEC: Real time feedback QEC is operations of performing low-latency, high-speed decoding to obtain a specific location of an error after syndrome bits are obtained by performing some syndrome measurements, and performing physical error correction directly on a data qubit in which an error occurs before a next round of syndrome measurements is performed.
15. Physical qubit: A physical qubit is a qubit implemented by using a real physical device, and includes data qubits and auxiliary qubits.
16. Logical qubit: A logical qubit is a mathematical degree of freedom in the Hilbert subspace defined by an error correction code. The description of a quantum state of the logical qubit is usually a many-body entangled state, and is generally a plurality of physical qubits jointed with two-dimensional subspaces in the Hilbert space. FTQC may need to be run on a logical qubit protected by an error correction code.
17. Quantum gate/circuit: A physical quantum gate/circuit is a quantum gate/circuit that acts on a physical qubit.
18. Data error: A data error is an error occurring on a data qubit.
19. Measurement error: A measurement error is an error caused by an imperfect measurement process.
20. Threshold theorem: In a threshold theorem, for a QC scheme that meets an FTQC requirement, when error rates of operations are less than a threshold, a better error correction code, more qubits, and more quantum operations may be used to enable the accuracy of computation to arbitrarily approximate to 1. In addition, additional resource overheads may be ignored relative to the exponential/polynomial acceleration of QC.
21. Neural network: An artificial neural network is an adaptive nonlinear dynamic system formed by a large quantity of simple basic elements, that is, neurons, connected to each other. A structure and a function of each neuron are relatively simple, but a system behavior generated by a combination of a large quantity of neurons is complex, and can express any function.
22. Convolutional neural network (CNN): CNN is a type of feedforward neural network including convolutional computation and having a deep structure. A convolutional layer is a keystone of the CNN, that is, a discrete two-dimensional or three-dimensional filter (also referred to as a convolution kernel, which is a two-dimensional or three-dimensional matrix) that performs a convolution operation with a two-dimensional or three-dimensional data lattice.
23. Fully connected layer: A fully connected layer is also referred to as a fully-connected layer, a fully connected network, or a fully-connected network. Each output node of the fully connected layer is connected to input nodes of a previous layer to integrate previously extracted features.
24. Rectified linear unit layer (ReLU layer): A ReLU f(x)=max (0, x) is used as an activation function of a neural network.
25. Error back propagation (BP) algorithm: An error BP algorithm is a supervised learning algorithm in an artificial neural network. The BP neural network algorithm can approximate to any function theoretically, and a basic structure thereof is formed by nonlinear change units and has a strong nonlinear mapping capability.
26. Field programmable gate array (FPGA).
27. Pipeline technology: The pipeline technology is a quasi-parallel processing implementation technology of overlapping operations belonging to different parts during an operation task for operation.
28. Quantization of neural network model: Quantization is to compress an original network by reducing a quantity of bits desirable to represent each weight. Neural network models generally take up a huge storage space. If a neural network algorithm is to be implemented on a hardware chip, a large amount of valuable on-chip storage space, on-chip registers, and wiring are occupied, and the calculation speed is severely affected. Since such parameters are of a floating-point number type, an ordinary lossless compression algorithm cannot effectively handle this embodiment. If calculation is performed using another simple numerical type (for example, a fixed-point operation) within the model without affecting the accuracy of the model, hardware computing resources consumed (including hardware computing units and storage units) are greatly reduced. For a decoding chip of a real-time feedback system, a quantization algorithm greatly reduces a calculation amount per unit time, thereby reducing the latency.
29. Multiply Accumulate (MAC or MA) operation: The MA operation is a special operation in a digital signal processor or some microprocessors. A hardware circuit unit that implements this operation is referred to as a "multiplier accumulator". This operation is to add a product result of the multiplication and a value of the accumulator, and then store a result of the addition in the accumulator.
30. Low-voltage differential signaling (LVDS): LVDS is an electrical standard for low-voltage differential signals, and is a method of serially transmitting data using differential signals. LVDS is generally physically implemented using twisted-pair wires, and can perform high-speed transmission at a relatively low voltage. LVDS is only a parameter on the physical level, and does not involve communication methods on the protocol level, and therefore, has a low latency.
31. Arbitrary waveform generator (AWG): An AWG receives waveform information configured with a digital signal, and generates corresponding analog waveforms after digital-to-analog conversion. In a quantum measurement and control system, the AWG is configured to generate waveforms for controlling and reading qubits.
32. Digital acquisition (DAQ) unit: A DAQ unit receives an inputted analog signal and obtains a corresponding digital signal after digital-to-analog conversion, the digital signal being used for the following processing. In the quantum measurement and control system, the DAQ unit is configured to receive a reading result of a quantum chip.
33. Quantum control processor (QCP): A QCP is a module that executes a quantum instruction, receives a result from a DAQ unit during an experiment, and controls an AWG to send a waveform corresponding to a quantum operation. In the quantum measurement and control system, the QCP processes, in real time, an instruction generated by a quantum program, to perform program flow control and feedback control.
34. Quantum measurement and control system: A quantum measurement and control system is a system that executes a quantum program by running a quantum instruction set, provides an input signal to a quantum chip for control, and measures the quantum chip and acquires a result. In superconducting QC, a quantum measurement and control system usually includes the AWG, DAQ unit, and QCP.

The concern of the technical solution of the present disclosure is described below: real-time feedback FTQEC (or referred to as "real-time feedback fault-tolerant error correction").

Since qubits are extremely susceptible to noise, with existing technologies, it is still not practical to directly implement QC on physical qubits. The development of QEC code technology and FTQC technology makes it possible to implement QC of arbitrary precision on qubits with noise. Generally, a long-distance quantum gate may need to be introduced for measuring (also referred to as syndrome measurement or a parity check) a stabilizer generator of a QEC code, and a complex auxiliary quantum state also may need to be prepared by using an additional qubit to perform fault-tolerant error correction. Due to the limitation of existing experimental means, a high-precision long-distance quantum gate cannot be realized, and a complex auxiliary quantum state cannot be prepared. The solution of performing FTQEC and FTQC by using topological QEC codes does not require the use of the long-distance quantum gate (because stabilizer generators are locally adjacent in space) and the preparation of the complex auxiliary quantum state (usually only a standard state of a single qubit or two qubits may need to be prepared), and a fault-tolerant threshold is relatively high, so that the solution is considered to be a solution that possibly implements general FTQC by using an existing experiment technology. As a special topological QEC code, a surface code is used as an example for descriptions in the present disclosure, but the core idea is applicable to any topological QEC code.

As an error correction code, after an error occurs, error syndromes can be obtained through a parity check. An occurrence position and a type (which is an X error, a Z error, or both, that is, a Y error) of the error may need to be further determined by using a specific decoding algorithm for the error correction code and according to the syndromes. For a surface code (or a general topology error correction code), an error and an error syndrome have specific spatial positions: When an error causes syndromes, an eigenvalue of an auxiliary qubit in a corresponding position is 1 (which can be considered as that a point particle occurs in the position); and when there is no error, the eigenvalue of the auxiliary qubit in the corresponding position is 0. In this embodiment, the decoding may be summarized as the following: A spatial digital array (which is a two-dimensional array or a three-dimensional array with a value of 0 or 1) is given, qubits in which errors are most likely to occur and specific error types are inferred according to a specific error occurrence model and a probability distribution of errors occurring in the qubits, and error correction is performed according to the inference result.

Figure 2:
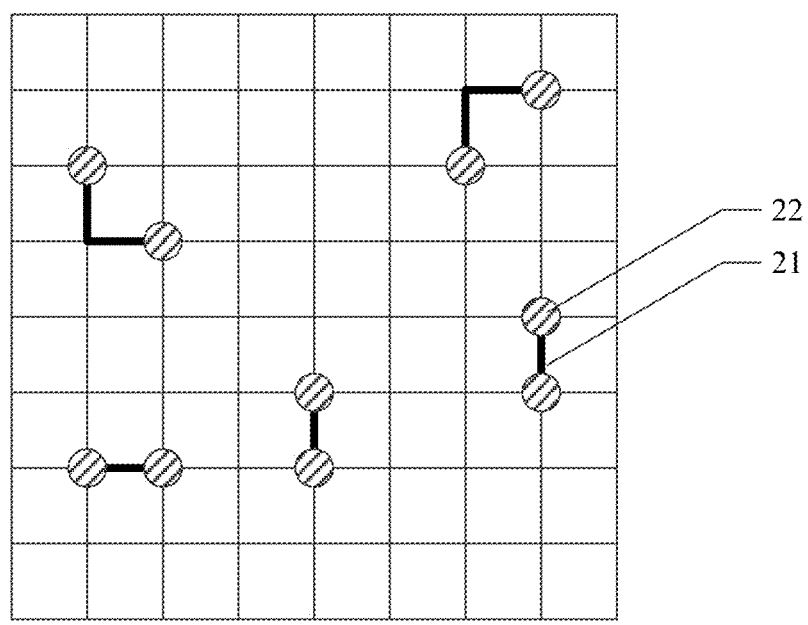
FIG. 2 is a schematic exemplary diagram of occurrence of a surface code error according certain embodiment(s) of the present disclosure.

FIG. 2 is a schematic diagram of occurrence of a surface code error. Qubits are on edges of a two-dimensional array, and auxiliary qubits for measuring error syndromes are on nodes of the two-dimensional array (the syndromes are obtained through perfect measurement). In FIG. 2, a black edge 21 represents an error chain formed by qubits in which errors occur, and a circle part 22 filled with slashes represents a point in which a syndrome value caused by an error is 1. Decoding can be performed provided that a chain-shaped error can be determined based on point-shaped syndromes.

If the syndrome measurement process is perfect and noise-free, a decoding algorithm may be run directly based on the syndrome information to determine a specific data qubit in which the error occurs. However, in actual situations, noise is present in quantum circuits (including syndrome measurement circuits).

Figure 3:
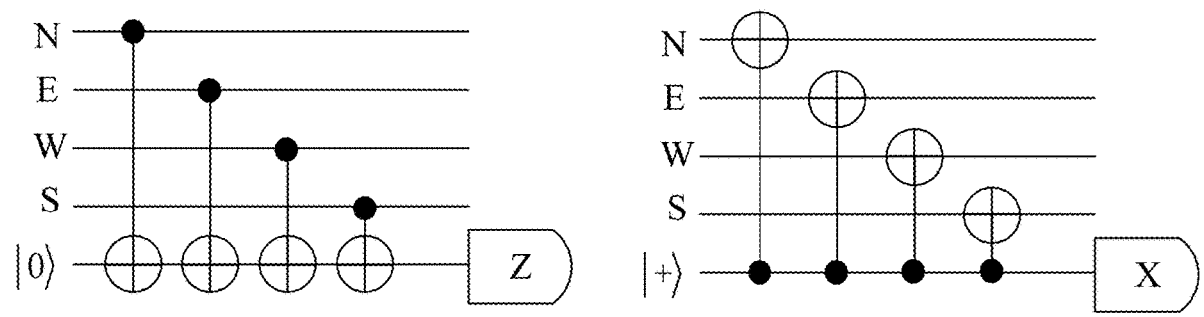
FIG. 3 is a schematic exemplary diagram of a syndrome measurement circuit according to certain embodiment(s) of the present disclosure.

FIG. 3 exemplarily shows a circuit for syndrome measurement of two types of stabilizer generators of Z and X, where N, E, W, and S represent data qubits in the north, east, west, and south of the auxiliary qubits. The order is important; otherwise, the decoding performance is severely degraded.

Figure 4:
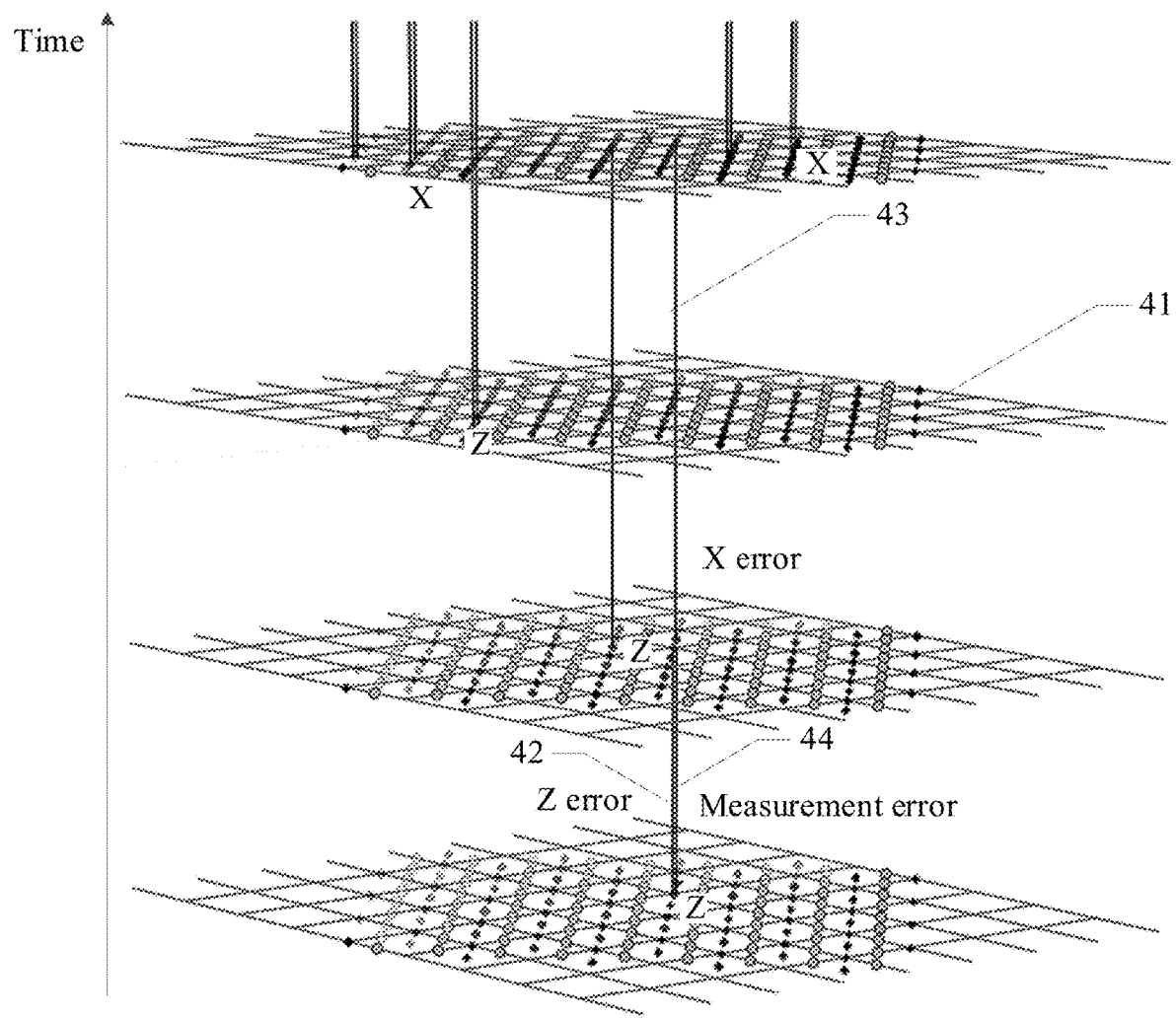
FIG. 4 is a schematic exemplary diagram of a three-dimensional syndrome bit array according to certain embodiment(s) of the present disclosure.

Therefore, syndrome information obtained through only one syndrome measurement cannot be directly used for decoding because it instead introduces correlated noise, causing errors in a large region of data qubits, and quickly destroying logical qubits. Generally, for a surface code with a scale of L, O(L) measurements may need to be performed within a period of time to establish sufficient syndrome information (which may be considered as a three-dimensional syndrome history graph, as shown in FIG. 4, where the vertical third dimension represents time), so as to determine, based on the information, which syndromes are problematic and which are reliable during this period of time, determine data qubits and auxiliary qubits in which errors have occurred in O(L) during this period of time, and correct the errors on the data qubits. The process including a plurality of times of syndrome measurement-physical error correction may need to be repeated until a quantum storage process ends. The whole process is referred to as real-time fault-tolerant quantum storage. Theoretical results prove that, when various types of noise (storage, preparation, a quantum gate, measurement, and the like) occurring in qubits are independent of each other, and the intensity is below a specific threshold, the impact of the noise can be reduced to arbitrarily small by increasing L, which is a fault-tolerant threshold theorem. The threshold theorem is the theoretical cornerstone to ensure the implementation of general QC at any scale.

FIG. 4 is a schematic exemplary diagram of a three-dimensional syndrome bit array obtained through a plurality of syndrome measurement. A total of four slices 41 are included in FIG. 4, and each slice 41 represents error syndrome information obtained through one measurement. A light circle represents a data qubit, and a dark cross represents an auxiliary qubit. A line 42 represents syndromes caused by a Z error, a line 43 represents syndromes caused by an X error, and a line 44 represents a measurement error. X, Z, and the like represent equivalent errors that occur in the data qubit.

Figure 5:
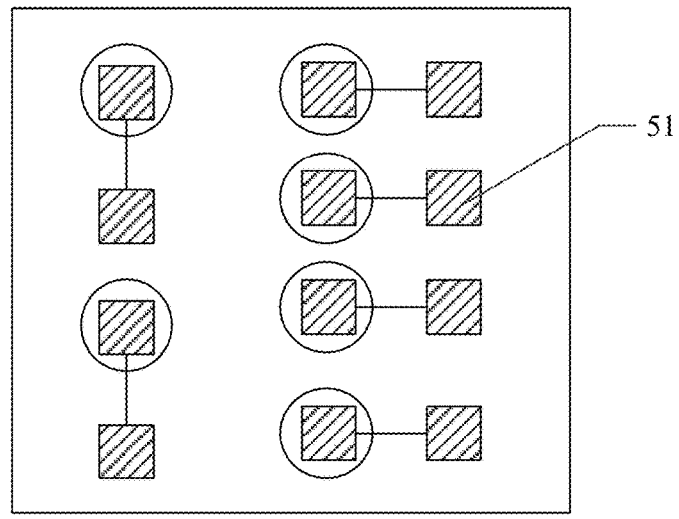
FIG. 5 is a schematic exemplary diagram of implementing an FTQC scheme on a surface code according to certain embodiment(s) of the present disclosure.

Based on the implementation of real-time fault-tolerant quantum storage, FTQC may be further implemented. A classic calculation scheme using surface codes is described herein, as roughly shown in FIG. 5. First, to implement QC, one logical qubit is not enough, and more logical qubits may need to be encoded. Such an encoding manner implements two protected degrees of freedom by canceling the measurement on a stabilizer generator of a connection region on the surface to form a hole, so that a logical qubit can be formed. The meaning of "degree of freedom" herein may be considered as a variable that is not defined in advance. Since there may not be a need to fix an eigenvalue of the stabilizer generator, the eigenvalue of the generator may be either 0 or 1, which is the degree of freedom of two values. To facilitate a fault-tolerant operation, two holes of equal size are usually selected to form four logical degrees of freedom, and two degrees of freedom are selected to implement one logical qubit. As shown in FIG. 5, two holes connected by a line form one logical qubit 51. Perimeters of the holes and a length of the straight line connecting the two holes determine the protection capability of the surface code to this logical qubit 51. When fault-tolerant QC is performed, the holes may need to be moved and twisted on the surface through the interactive measurement of individual qubits and stabilizer generators. In addition, syndrome measurement is performed without interruption in the process, and an error that occurs in the data qubit is immediately corrected (real-time feedback error correction).

To simplify the problem, only real-time feedback error correction for a quantum memory is considered in the present disclosure, which is a key step to implement general FTQC, and there is no essential difference between the two from the perspective of real-time feedback control. In the present disclosure, the attention is focused on an electronics/microwave system that controls a quantum chip, and it is assumed that a manufacturing process of the quantum chip (or another QC physical body) itself is sufficiently mature, so that noise borne by a prepared qubit meets a spatial independence assumption, and the intensity of various noises is less than a threshold of the surface code (a value<about 1%).

Figure 6:
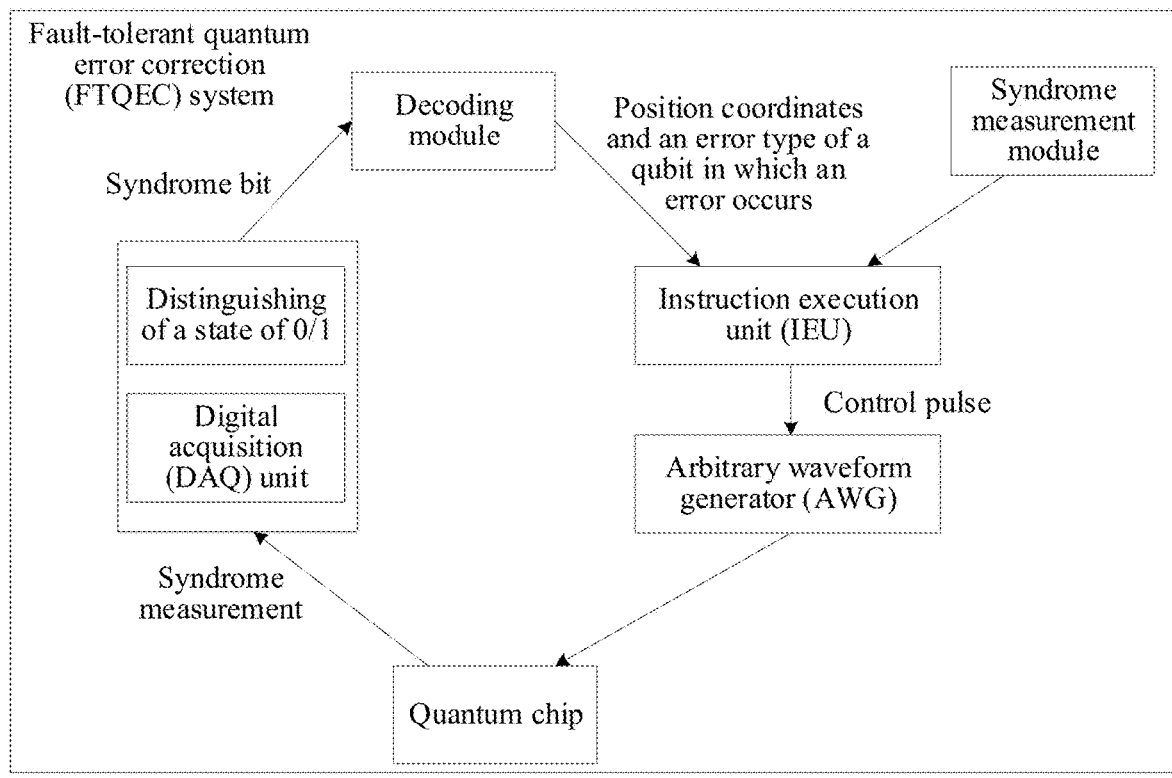
FIG. 6 is an exemplary structural diagram of a real-time fault-tolerant error correction system according to certain embodiment(s) of the present disclosure.

Currently, there is no real-time fault-tolerant error correction system for a surface code or any other topological error correction code. Generally, for any physical platform that implements QC (including superconductivity, ion trap, neutral cold atom, a linear optical system, and the like), an implementation framework of an FTQEC system is shown in FIG. 6. According to FIG. 6, a real-time feedback error correction process is divided into the following steps:

Step 1. A syndrome measurement module sends an instruction for syndrome measurement to an AWG through an instruction execution unit (IEU) for generating a waveform sequence desirable by a syndrome measurement circuit as shown in FIG. 3 and performing symptom measurement by using a quantum chip.

Step 2. Distinguish, after an obtained measurement signal passes through a DAQ unit, data points between states of 0 and 1, and generate and temporarily store syndrome bits.

Step 3. Collect, after the steps 1 and 2 are repeated for O(L) times, syndrome information, and simultaneously transmit syndrome bits to a decoding module for decoding.

Step 4. The decoding module generates position coordinates and an error type of a qubit in which an error occurs, and transmits the information to the AWG.

Step 5. The AWG generates, according to the position and type of the error, a waveform (an optical signal or a microwave signal, depending on the physical implementation of underlying qubits) of an operation (usually, an X gate or a Z gate) desirable for correcting the error, the waveform acting on the corresponding qubit to perform error correction.

An error correction system that can perform general FTQC may need to meet the following two conditions:

Condition 1: Scalability. Since FTQC ultimately often requires tens of millions of physical qubits, it is desirable to ensure that resources consumed by an electronic control system for error correction do not increase too fast with an increase in a quantity of logical qubits.

Condition 2: Low latency. In an error correction process, from collecting O(L) syndrome measurement to performing the error correction, because no syndrome measurement can be performed, qubits are exposed to noise, which affects the subsequent error correction effect. Therefore, real-time feedback error correction often requires a low latency. As a quantity of qubits increases, the latency of decoding may need to increases slowly.

Regarding the condition 1, since the existing experiment is still far away from tens of millions of physical qubits, none of the existing cybernetic systems takes the condition 1 into consideration.

Regarding the condition 2, real-time error correction often requires no syndrome measurement during the steps 3 to 5, that is, a quantum state is exposed to the noise environment during this period of time, and error-related information cannot be extracted. Therefore, a longer time indicates heavier impact on error correction. Therefore, the execution time of steps 3 to 5 may need to be as short as possible. In certain embodiment(s), the execution time of steps 3 to 5 includes:

1. a time for a signal to be transmitted to the error correction system after syndrome qubit measurement is performed;
2. a time for the DAQ unit, distinguishing between 0 and 1, and transmitting the syndrome bits to the decoding module;
3. a running time of the decoding algorithm;
4. a time for transmitting a decoding result to the AWG; and
5. a time for the AWG to generate a control waveform and transmit the control waveform to a chip.

Figure 7:
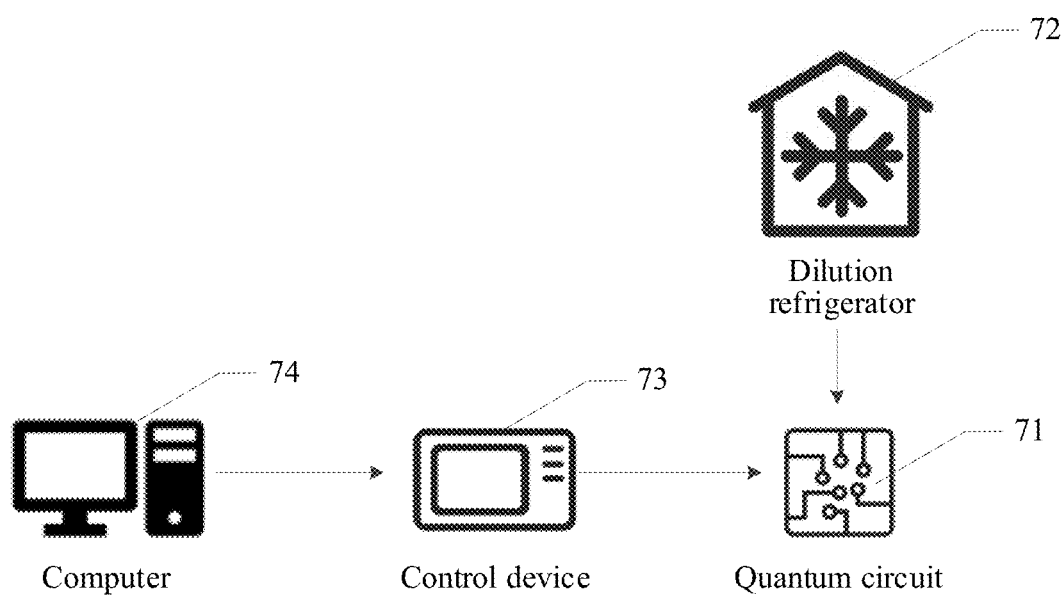
FIG. 7 is a schematic exemplary diagram of an implementation scenario of a solution according to certain embodiment(s) of the present disclosure.

FIG. 7 is a schematic diagram of an implementation scenario of a solution according to an embodiment of the present disclosure. As shown in FIG. 7, the implementation scenario may be a superconducting QC platform. The implementation scenario includes: a quantum circuit 71, a dilution refrigerator 72, a control device 73, and a computer 74.

The quantum circuit 71 is a circuit acting on a physical qubit, and the quantum circuit 71 may be implemented as a quantum chip such as a superconducting quantum chip at around absolute zero. The dilution refrigerator 72 is configured to provide an environment of absolute zero for the superconducting quantum chip.

The control device 73 is configured to control the quantum circuit 71, and the computer 74 is configured to control the control device 73. For example, a programmed quantum program is compiled into an instruction by using software in the computer 74 and transmitted to the control device 73 (for example, an electronic/microwave control system), and the control device 73 transforms the instruction into an electronic/microwave control signal and inputs the electronic/microwave control signal into the dilution refrigerator 72, to control superconducting qubits at a temperature of less than 10 mK. A reading process is opposite to the above, and a read waveform is transmitted to the quantum circuit 71.

Figure 8:
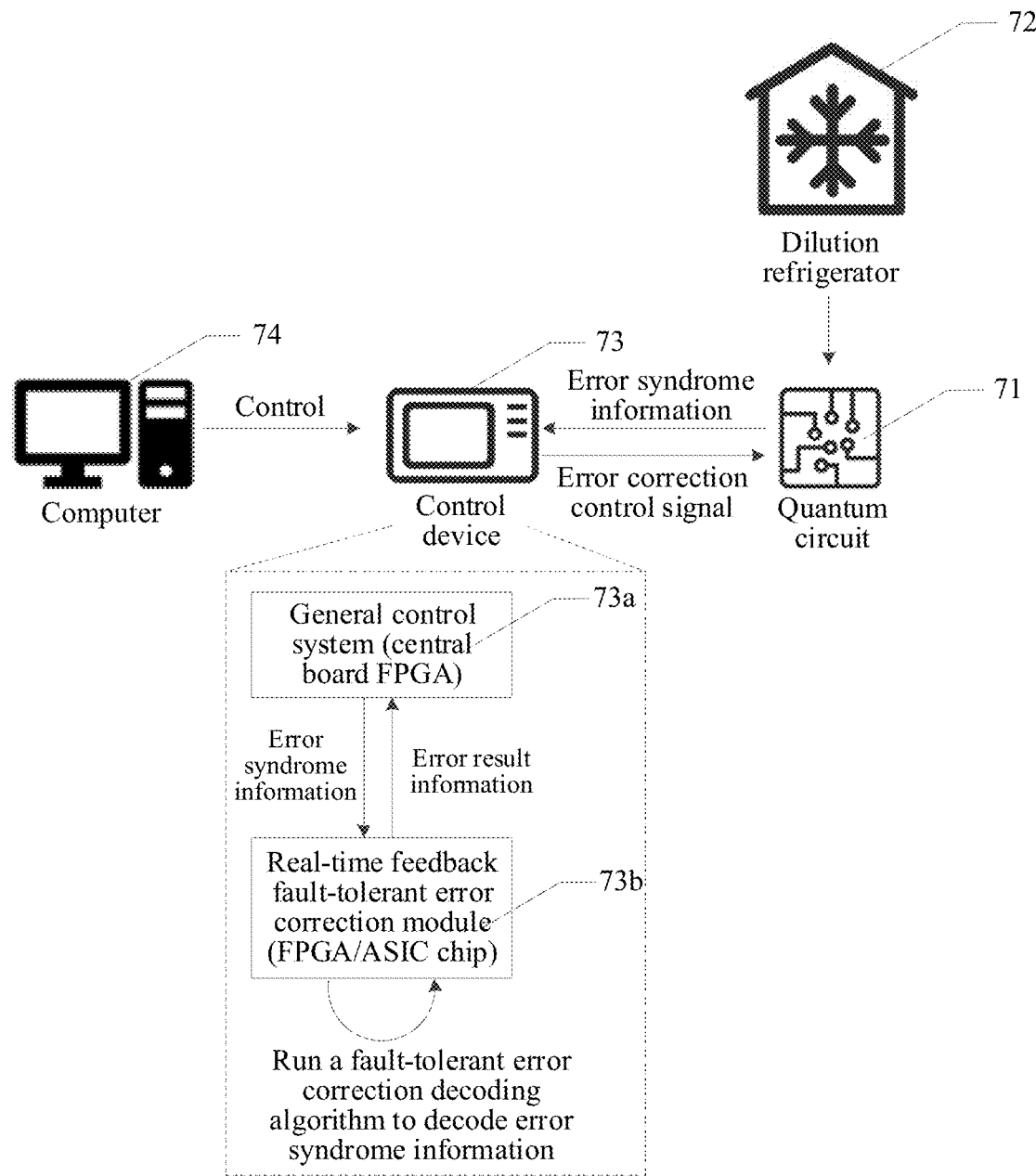
FIG. 8 is a schematic diagram of an error correction decoding process involved in the implementation scenario of the solution shown in FIG. 7 according to certain embodiment(s) of the present disclosure.

As shown in FIG. 8, an embodiment of the present disclosure provides a decoding algorithm that can implement real-time feedback fault-tolerant error correction. The decoding algorithm is combined with the control device 73 (for example, the decoding algorithm is integrated into the electronics/microwave control system). After reading error syndrome information from the quantum circuit 71, a general control system 73a (for example, a central board FPGA) of the control device 73 transmits an error correction instruction to a real-time feedback fault-tolerant error correction module 73b of the control device 73. The error correction instruction includes error syndrome information of the quantum circuit 71. The real-time feedback fault-tolerant error correction module 73b may be an FPGA or an implementation-specific integrated circuit (ASIC) chip. The real-time feedback fault-tolerant error correction module 73b runs the decoding algorithm to decode the error syndrome information, and transforms, in real time, error result information obtained through decoding into an error correction control signal and transmits the error correction control signal to the quantum circuit 71 for error correction, thereby protecting the qubits.

The background of real-time feedback fault-tolerant error correction is described above, and the whole control system is presented with reference to FIG. 7 and FIG. 8. To implement FTQC, it is desirable to implement real-time feedback error correction of the quantum memory, which is also the focus of the technical solution of the present disclosure. The implementation details of the present disclosure on the entire system are described in detail herein.

Figure 9:
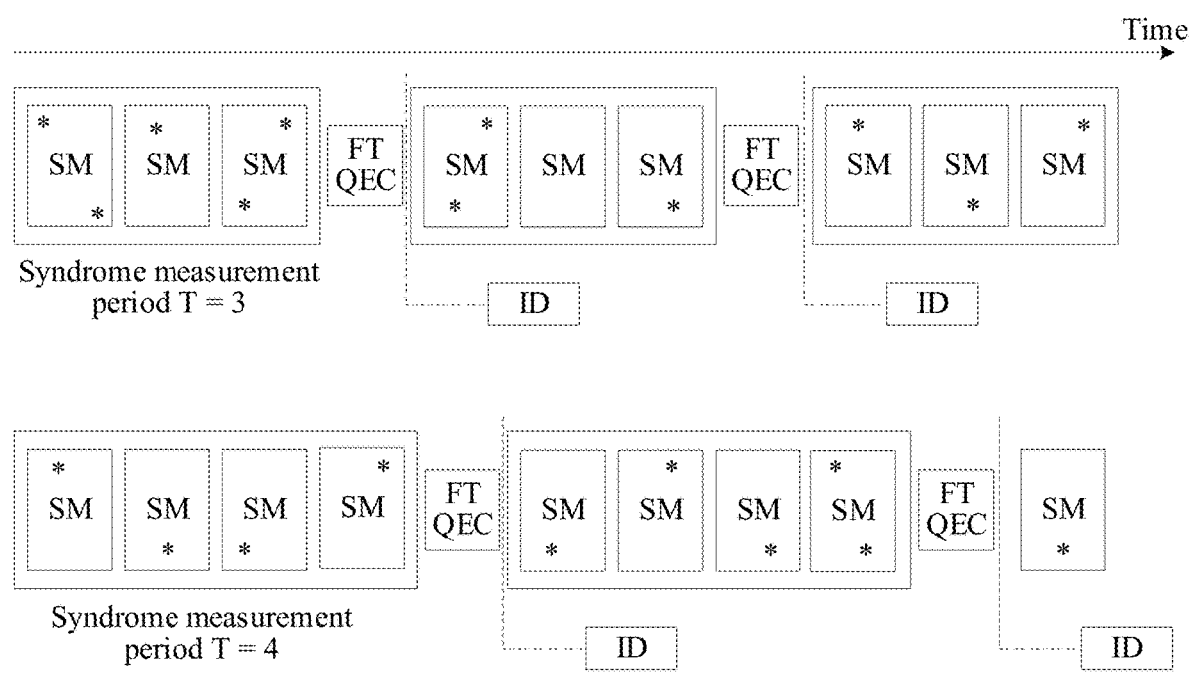
FIG. 9 is a schematic timing diagram of real-time feedback fault-tolerant error correction according to certain embodiment(s) of the present disclosure.

FIG. 7 and FIG. 8 show system framework diagrams of real-time feedback fault-tolerant error correction of a quantum memory. From the perspective of timing, the entire error correction timing is shown in FIG. 9. After a scale L is given, a specific syndrome measurement period T may need to be selected. In FIG. 9, SM represents syndrome measurement, and an asterisk represents an error (storage or measurement error) that occurs. In FIG. 9, T=3 and T=4 are selected as examples.

To study the performance of the decoding algorithm, simulation is desirable. During simulation of a decoding process, each time decoding (FTQEC) is performed, ideal decoding (ID) of perfect syndrome measurement may be performed once to determine whether a logical error has occurred at this time point so as to correct the error. When it is determined that a logical error occurs, a total elapsed time is recorded. An average value of the time is obtained through a plurality of simulations, which is the lifetime of a logical bit. A reciprocal of the lifetime is a decoding error rate. According to the actual observation using an MWPM decoder, a larger decoding period T indicates a better error correction effect. However, when T exceeds 2L, the performance improvement is no longer obvious, and a logical error rate approaches a limit. Meanwhile, the complexity of decoding increases rapidly (a quantity of accumulated syndrome bits is too large). Therefore, T≤2L is selected.

In an FTQEC module, an SNND algorithm is used to decode topological QEC codes. The SNND algorithm is described herein first.

Because the syndrome bits are contaminated with noise, a plurality of neural network decoders may need to be used to infer logical error classes and values of specific syndrome bits respectively. A scale of a QEC code (for example, a surface code) being L is used as an example herein. The inputted error syndrome information may be further divided into two groups of an X class and a Z class. A quantity of syndrome bits included in each group is half of a total quantity of syndrome bits, that is, (L2−1)/2 bits, which are used to correct X and Z errors respectively. The X group is used as an example. Syndrome bits that may need inference may be further divided into (L2−1)/2N groups. Each group includes N (N is a positive integer) syndrome bits, and the syndrome bits of each group are inferred by using a neural network for, that is, correspond to 2N classification problems. In this way, the X (or Z) group may need a neural network to classify and infer X (or Z) logical errors, and the remaining (L2−1)/2N neural networks infer values of (L2−1)/2N syndrome bits. A total of (L2−1)/N+2 neural networks are desirable.

Figure 10:
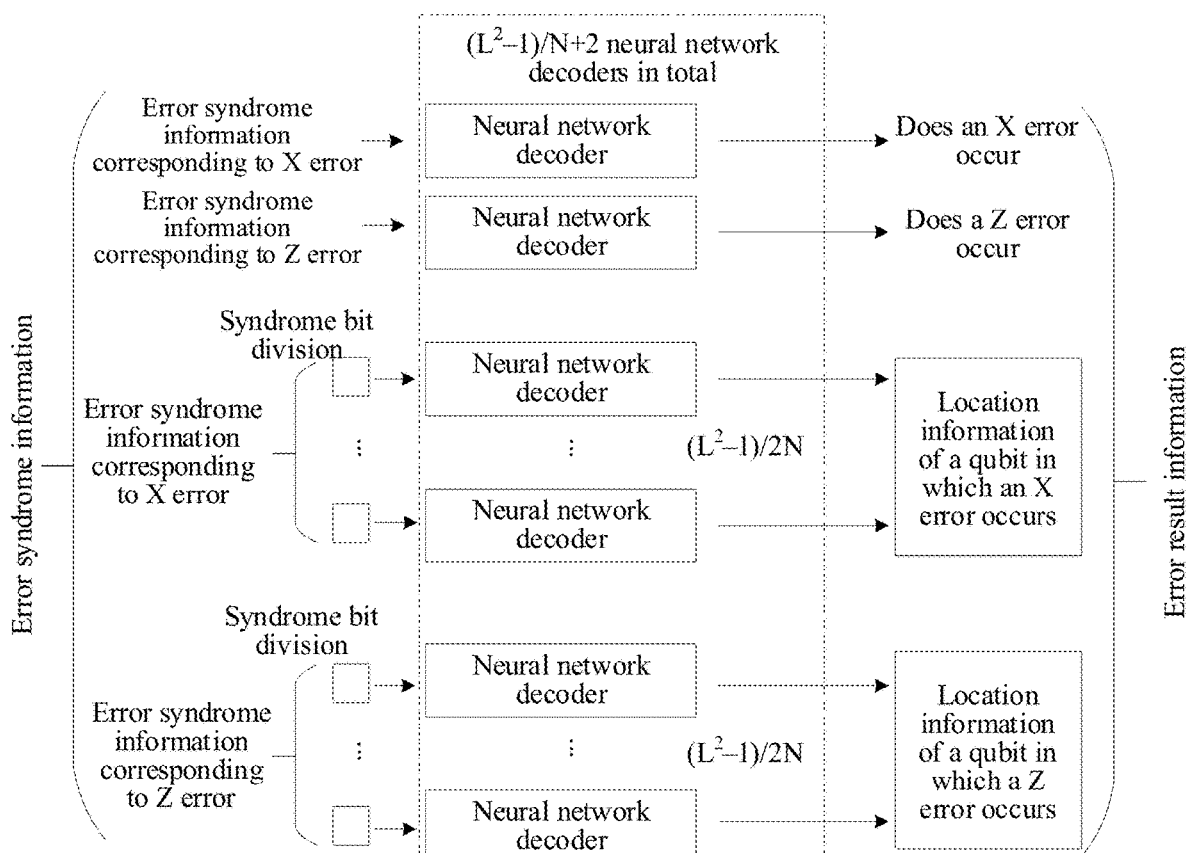
FIG. 10 is a schematic diagram of a multi-neural network fault-tolerant decoding framework according to certain embodiment(s) of the present disclosure.

FIG. 10 exemplarily shows a multi-neural network fault-tolerant decoding framework. A scale of the QEC code is L, and a quantity of the neural network decoders is (L2−1)/N+2. One neural network decoder is configured to determine, based on error syndrome information corresponding to an X error, whether the X error occurs. One neural network decoder is configured to determine, based on error syndrome information corresponding to a Z error, whether the Z error occurs. The error syndrome information corresponding to the X error is divided into (L2−1)/2N groups, each group including N syndrome bits, the syndrome bits of each group being decoded by using one neural network decoder to obtain location information of a qubit in which the X error occurs. The error syndrome information corresponding to the Z error is divided into (L2−1)/2N groups, each group including N syndrome bits, the syndrome bits of each group being decoded by using one neural network decoder to obtain location information of a qubit in which the Z error occurs. That is, two neural network decoders infer an error type, and the remaining neural network decoders infer location information of a qubit in which an error occurs. The two pieces of information are combined, to infer errors that occur in a physical qubit.

Figure 11:
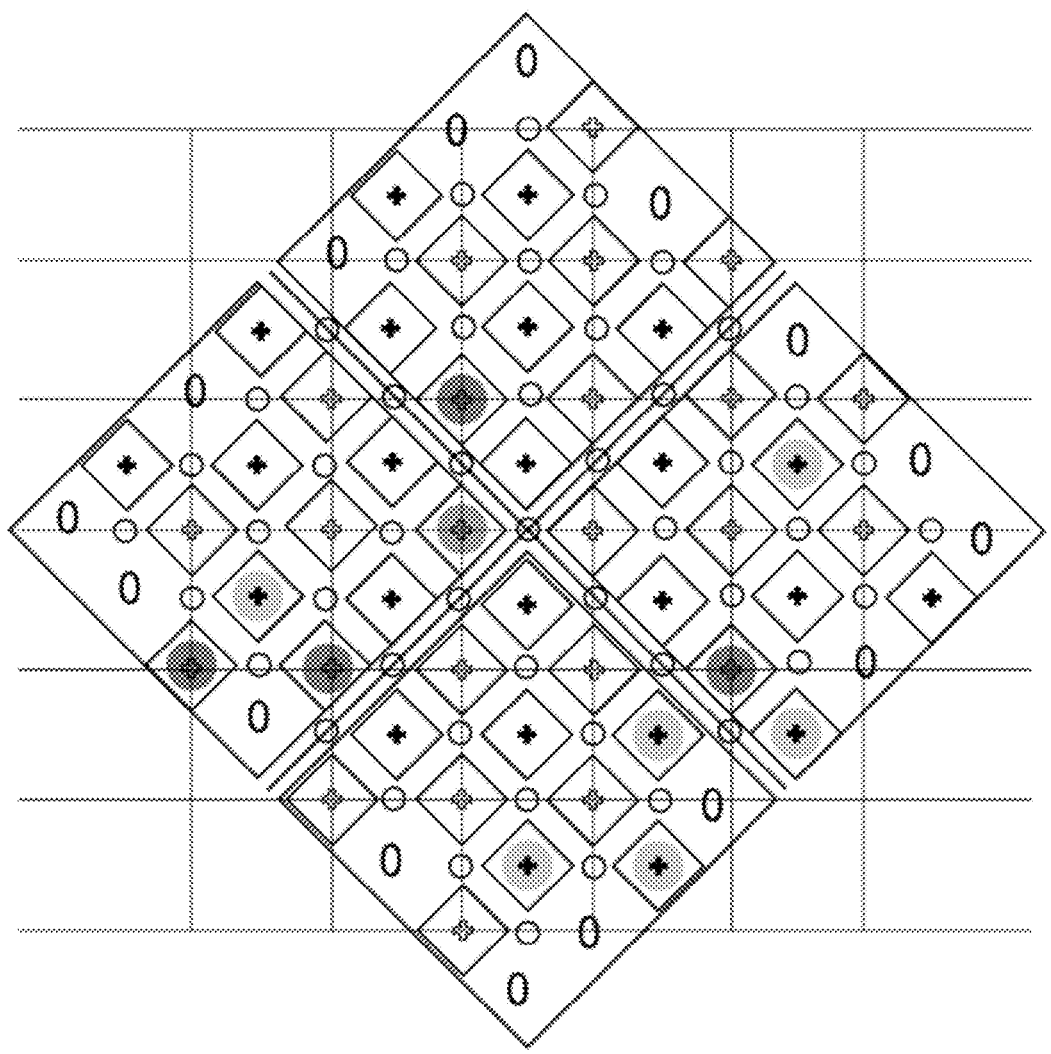
FIG. 11 is a schematic diagram of error syndrome segmentation according to certain embodiment(s) of the present disclosure.
Figure 12:
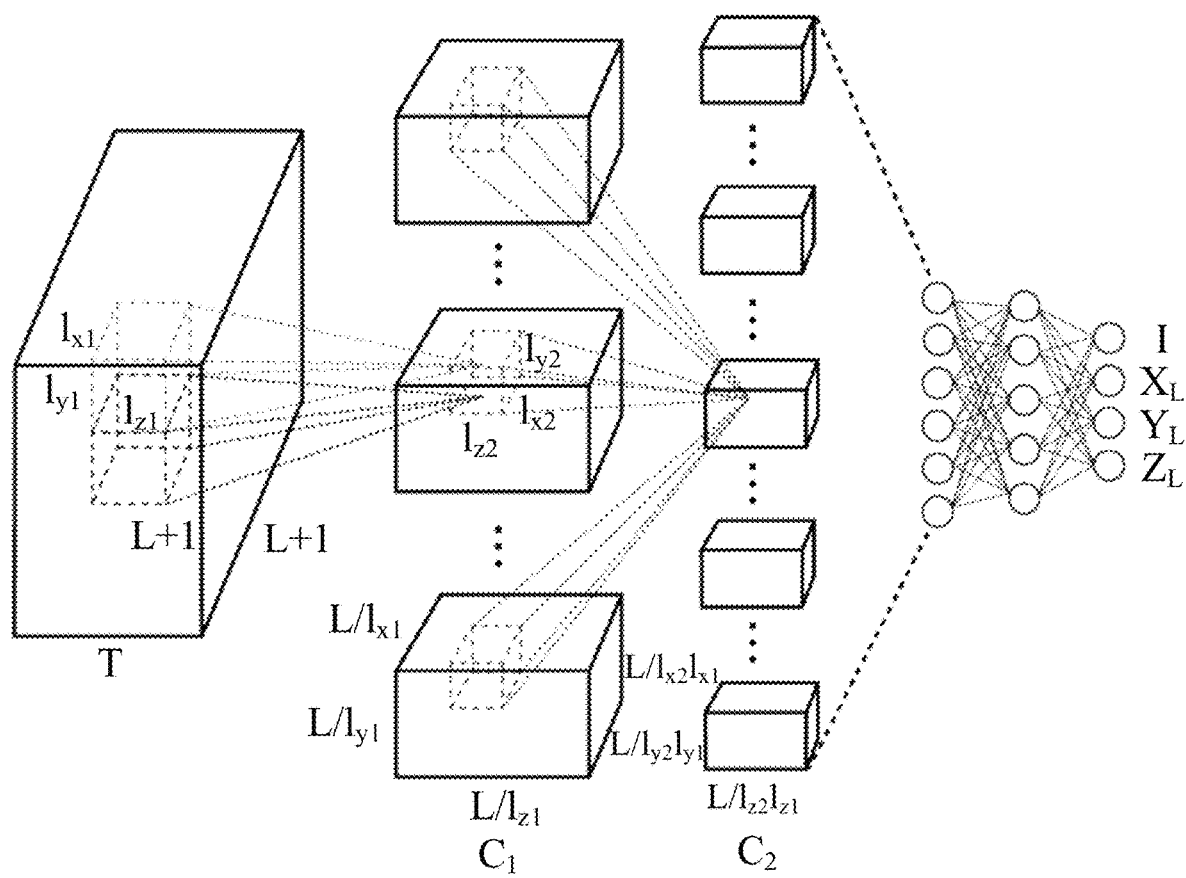
FIG. 12 is a schematic diagram of a renormalization group-inspired (RG-inspired) shallow neural network according to certain embodiment(s) of the present disclosure.

Generally, a neural network is directly selected for training. When L is relatively large, the effect is unsatisfactory. To construct a scalable solution, a neural network is constructed according to the idea of a renormalization group (RG) decoder. The core idea is that using a 3D CNN to perform feature extraction on information extracted in a previous layer may be considered as a first-level decoding process. An output of each layer is a set of three-dimensional arrays, which may be an output probability distribution of a soft decoder. In this way, during syndrome extraction at each layer, each three-dimensional array may be divided into blocks, and a three-dimensional convolution kernel is directly used to convolve three-dimensional sub-matrices obtained after the block division. FIG. 11 is a schematic diagram of RG-inspired syndrome segmentation. In certain embodiment(s), a stride of the convolution is:

$$\text{stride=kernel size}=(l_x,l_y,l_z),$$

where stride represents the stride of the convolution, kernel size represents a size of the convolution kernel, and lx, ly, and lz are scales of the convolution kernel in x, y, and z directions. After the convolutional networks, a fully connected layer is used for classification, and the entire network is shown in FIG. 12. The scale of the fully connected layer herein is basically independent of L and is relatively fixed. In practical implementations, a convolution moving stride may be slightly smaller than the size of the convolution kernel, that is, the convention kernel partially overlap adjacent sub-matrices convolved by the convolution kernel. In addition, stride and kernel=(1, 1, 1) may be used appropriately to extract more information while compressing a quantity of channels. Training results show that, such measures speed up the progress of training convergence and obtain better decoding performance without increasing the depth of the network.

Finally, training samples are desirable to use a known decoding algorithm (for example, an MWPM decoder, where a better decoder can generally be used) to generate a syndrome-error set, and errors are divided into logical errors and corresponding syndrome sets for training of different networks.

Once a model is trained, the model may need to be deployed on a decoding module of a real-time error correction system.

Figure 13:
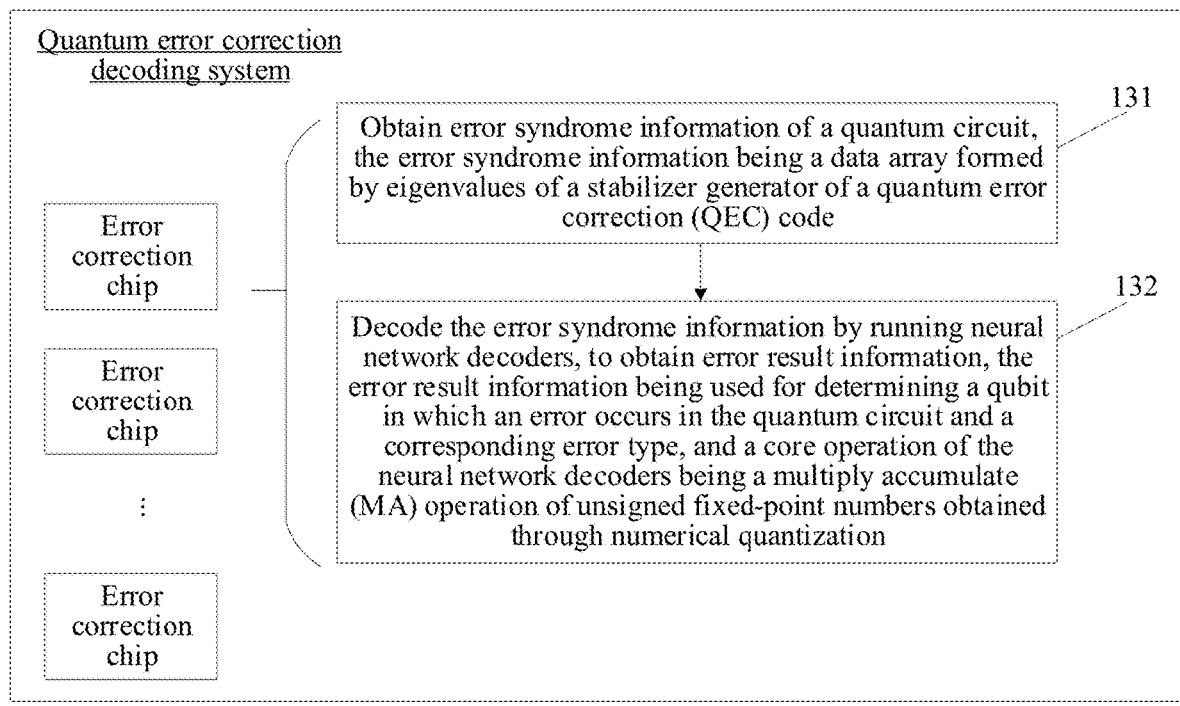
FIG. 13 is a schematic diagram of a QEC decoding system according to certain embodiment(s) of the present disclosure.

FIG. 13 is a schematic diagram of a QEC decoding system according to an embodiment of the present disclosure. The QEC decoding system includes a plurality of error correction chips, the error correction chips are configured to perform the following steps (131 to 132):

Step 131. Obtain error syndrome information of a quantum circuit, the error syndrome information being a data array formed by eigenvalues of a stabilizer generator of a QEC code.

An error syndrome measurement is performed on the quantum circuit by using a QEC code, and corresponding error syndrome information can be obtained. The error syndrome information is a data array including eigenvalues of a stabilizer generator of the QEC code. In certain embodiment(s), the error syndrome information is a two-dimensional or three-dimensional data array formed by 0 and 1. For example, when there is no error, an eigenvalue of the stabilizer generator is 0; and when an error occurs, an eigenvalue of the stabilizer generator is 1.

In this embodiment of the present disclosure, the QEC code may be a topological QEC code in any form. For example, the QEC code is a surface code. For a surface code, an error and an error syndrome have specific spatial positions. When an error causes a syndrome, an eigenvalue of an auxiliary qubit at a corresponding position is 1 (which may be considered that a point particle appears at the position). When there is no error, an eigenvalue of an auxiliary qubit at a corresponding position is 0. Therefore, for the surface code, if an error in an error correction process is not considered (that is, if a measurement process is perfect, the syndrome is referred to as a perfect syndrome), the error syndrome information may be considered as a two-dimensional array image formed by 0 and 1.

In addition, in consideration of that noise is generally present in the syndrome measurement process, a plurality of measurements may be performed within a period of time to obtain a three-dimensional data array formed by 0 and 1 as the error syndrome information. For details, reference may be made to the descriptions of FIG. 4 above, and details are not described herein again.

Step 132. Decode the error syndrome information by running neural network decoders, to obtain error result information, the error result information being used for determining a qubit in which an error occurs in the quantum circuit and a corresponding error type, and a core operation of the neural network decoders being a MA operation of unsigned fixed-point numbers obtained through numerical quantization.

The neural network decoder is a machine learning model that is configured to decode error syndrome information and that is constructed based on a neural network. Input data of the neural network decoder is error syndrome information, and output data is error result information corresponding to the error syndrome information. A physical qubit in which an error occurs in the quantum circuit and a corresponding error type may be determined based on the error result information outputted by the neural network decoder. For example, a position of a physical qubit in which an error occurs in the quantum circuit and an error type of the physical qubit in which the error occurs at the position are determined. For example, the error type is an X error, a Z error, or a Y error (the Y error indicates that there are both an X error and a Z error).

In certain embodiment(s), the neural network decoder includes an input layer, a hidden layer, and an output layer. There is at least one hidden layer, usually, a plurality of hidden layers. Error syndrome information is inputted from the input layer of the neural network decoder, and error result information finally obtained through feature extraction at the plurality of hidden layers is outputted from the output layer.

In the present disclosure, some design parameters are provided for the neural network decoder, so that the core operation of the neural network decoders is the MA operation of unsigned fixed-point numbers obtained through numerical quantization, thereby minimizing the data volume and the calculation amount desirable by the neural network decoders, so as to better meet the requirement of real-time error correction.

In this embodiment of the present disclosure, to facilitate the design and deployment of the entire system, and shorten the time desirable for decoding as much as possible, some requirements of normalization are raised for the QEC decoding system (for example, the neural network decoder and the error correction chips), that is, the QEC decoding system is obtained through normalization. The normalization includes, but is not limited to, at least one of the following:

1. The neural network decoders run on the plurality of error correction chips have the same network structure.

According to the present disclosure, in real-time fault-tolerant error correction, it is expected that neural network decoders output inference results with a consistent latency, and a location and a type of an error are comprehensively determined based on the inference results. Since a plurality of neural network decoders may need to be run at the same time for one decoding process, the present disclosure tends to use the same network structure and hardware structure (FPGA/ASIC) to implement neural network inference. For both the FPGA and ASIC, this greatly simplifies the design development process. Especially, when L is relatively large, and a relatively large quantity of neural network decoders are involved, if each neural network decoder deployed on the hardware may need to be redesigned and adjusted, a huge load is caused. This often requires the design of the neural network decoders to ensure consistency, so that when the model is mapped to hardware for execution, the design and manufacturing of the front-end and back-end are greatly simplified. In addition, when L is relatively large, more neural network decoders are desirable to produce a scale effect. The same structural design facilitates the mass tape-out production of FPGAs/ASICs to reduce costs. Therefore, the present disclosure often requires that neural network decoders have the same network structure (for example, including a quantity of weights of each layer, and a quantity of biases). Subsequent simulation results also show that, such a choice can already achieve the best decoding performance.

2. The hidden layer of the neural network decoder includes only a convolutional layer and a fully connected layer.

In the present disclosure, the hidden layer of the neural network decoder is only allowed to use the convolutional layer and the fully connected layer. This is because core operations of the two types of algorithms are matrix operations, which are easy to parallelize. To maximize parallelization, a quantity of network layers and computational complexity of the neural network decoders may need to be further reduced. Only the use of convolutional layers and fully connected layers is allowed, and the use of technologies, such as maxpooling, dropout, or BatchNorm, is abandoned to further simplify the model. Such simplification can also reduce data dependence, and reduce the difficulty of circuit implementation to a large extent. Practice shows that, reducing the auxiliary layers does not increase the training difficulty or produce over-fitting.

3. An activation function of the neural network decoder is a ReLU activation function.

To facilitate the implementation of hardware deployment, the present disclosure often requires activation layers of the neural network decoder to use the ReLU activation function. This is because when a digital circuit is used for a fixed-point operation (a specific quantization operation is mentioned herein elsewhere), the ReLU activation function determines an output depending only on a sign bit of a fixed-point number, and resets negative numbers with a sign bit of 1 to 0. This greatly simplifies the difficulty of hardware implementation. In addition, using the ReLU activation function can already produce sufficiently good decoding performance, and reach the near-optimal performance.

After the processing of the neural network decoder, there is only one type of core operation of the entire neural network decoder: the MA operation between arrays, so that the difficulty of hardware implementation is further reduced.

4. Each error correction chip runs one neural network decoder.

In certain embodiment(s), a quantity of networks may need to be reduced as much as possible without affecting the decoding performance. To minimize the latency (including transmission latency and calculation latency), when hardware resources are sufficient, it is expected in the present disclosure that each neural network decoder can be implemented on one or more FPGAs/ASICs, that is, an embodiment where a single chip operates a plurality of neural network decoders is not considered. In this way, a greater quantity of networks indicates a greater quantity of chips desirable. Minimizing the quantity of networks means fewer chips, which alleviates the difficulty of establishing the entire decoding system. An empirical method for selecting a roughly optimal quantity of networks is provided below.

5. The neural network decoder is adapted to error correction decoding of different quantum circuits.

In certain embodiment(s), it is further expected in the present disclosure that the neural network decoder has sufficient flexibility. In other words, the present disclosure often requires that a multi-neural network decoding model not only meets a specific noise model, but also meets different noise models. Even when a trained model is not well qualified for different noise models, the model may be retrained without modifying structure parameters of the model, and better decoding performance can be obtained. In this way, the decoding algorithm may be updated by only updating data stored on a chip such as a weight and a bias without redesigning/optimization/tape-out, to be better applicable to different quantum circuits.

L=5 is used as an example below to discuss the impact of model transformation on decoding performance. Specific model parameters with L=5 are given first. The model is expressed in pytorch code as follows:

```
super(CNN_3D_L_X,self)._init_( )
self.conv1=nn.Conv3d(1,500, stride=(4,1,3),kernel_size=(6,3,3),padding=0)
self relu1=nn.ReLU( )
self.fc1=nn.Linear(500*2*2*1,400)
self relu2=nn.ReLU( )
self fc2=nn.Linear(400,80)
self relu3=nn.ReLU( )
self fc3=nn.Linear(80, output_size)
```

In addition to ReLU, the model has only four layers, including one three-dimensional convolutional layer and three fully connected layers. In the present disclosure, two models are used to calibrate error classes, and four models are used for numerical calibration of syndrome bits. For networks for inferring syndromes, each network may need to calibrates six syndrome bits, and there are 26=64 states. Therefore, final output layers of the network are uniformly specified as 64. The total quantity of network parameters is about 800,000, requiring about 1 million floating-point multiplications.

Figure 14:
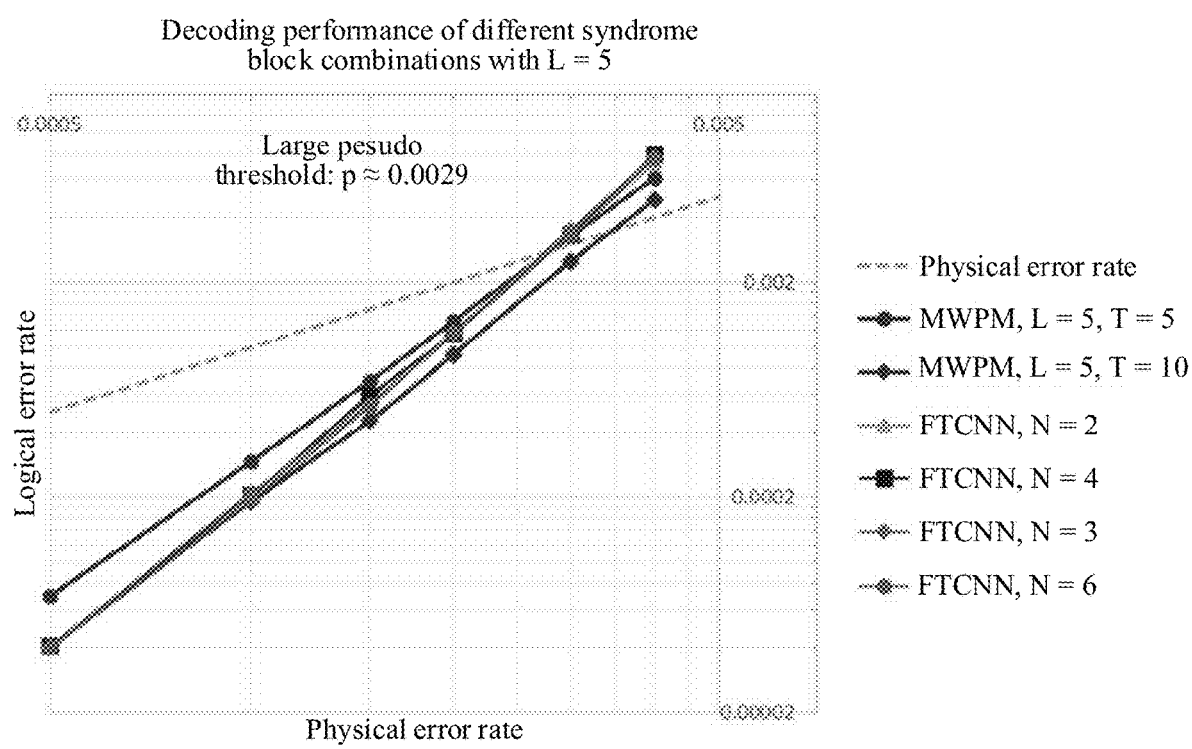
FIG. 14 is a schematic diagram of decoding performance of different syndrome block combinations according to certain embodiment(s) of the present disclosure.

The following embodiments are then considered respectively: N syndrome bits are used as a group, where N=2, 3, 4, or 6, and their values are inferred by using one neural network, that is, corresponding to 4, 8, 16, or 64 classification problems (that is, the output size variable in the pytorch code changes, and the rest remain unchanged). Total quantities of models corresponding thereto are 14, 10, 8, and 6 respectively. L=5 and T=10 are used, and noise sampling is performed around p=0.006. An MWPM decoder is used for training set generation, and then, the models are trained in the same way. It may be found that, for different values of N, the decoding performance (an error rate of logical qubits) is almost indistinguishable. That is, a larger N may be selected (for L=5, 2N<80), which hardly affects the decoding performance while greatly reducing the quantity of networks (referring to FIG. 14). This phenomenon also exists when L=7 or 9. This phenomenon is considered as a common phenomenon, that is, the distinguishing capability of the model is strong enough for resolving a plurality of classification problems at a sufficiently large scale. However, when output size is much larger than a quantity of nodes in the penultimate layer (which is 80 in the pytorch code example), the inference performance is degraded. Therefore, a quantity of nodes in an output layer is limited to less than a quantity of output nodes in the penultimate layer.

Figure 15:
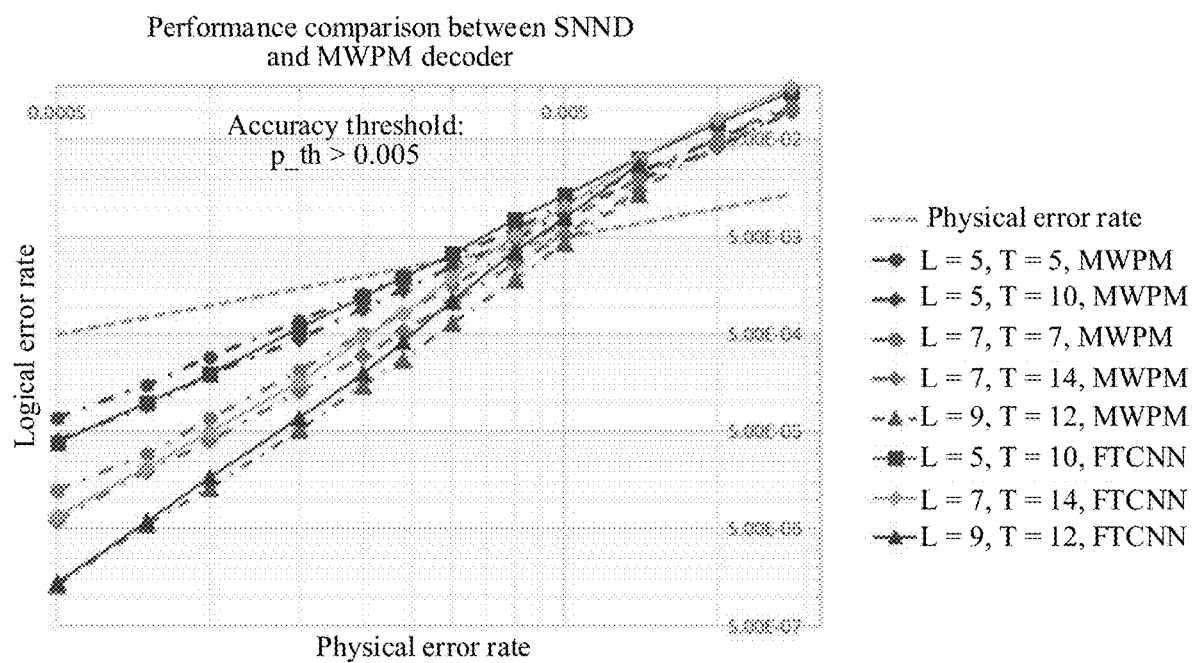
FIG. 15 is a schematic diagram of performance comparison between a shallow neural network decoder (SNND) and a minimum weight perfect matching (MWPM) decoder according to certain embodiment(s) of the present disclosure.

For L=7 or 9, similar to L=5, a model that meets the present disclosure is selected, p=0.006~0.007 is used for noise sampling, and a classic decoder is used to perform the training set generation. At present, the MWPM decoder that is most thoroughly researched and most widely applicable is still selected to decode an error syndrome generated through simulation, and obtained decoded data and a syndrome data set are used to generate a training set. It is considered later that a decoding algorithm with higher performance such as reinforcement learning is used to generate a training set, so as to achieve better decoding performance. Specific model parameters, other than L=5 given above, are not shown in the present disclosure. A decoder trained using a data set sampled at a standard circuit-level noise model (circuit-level depolarizing noise) with L=5, 7, or 9 is considered herein, a corresponding decoding period is T=10, 14, or 12, and a total quantity of models corresponding to N=6, 6, or 8 is 6, 10, or 12. The models used are designed to meet the requirements of model parameters. The specific decoding performance is shown in FIG. 15. It may be seen that, when a physical error rate is relatively low, the performance of an SNND (FTCNN in the figure) almost coincides with the performance of an MWPM decoder that trains the SNND, so that a theoretical limit is reached. When the error rate is relatively high, the performance of the SNND is slightly worse than that of the corresponding MWPM decoder. However, this is tolerable because a normal working range of fault-tolerant error correction often requires a relatively low physical error rate. For example, it is expected that in the future, a new decoder obtained through reinforcement learning training can generate a training set with higher quality to train the SNND.

The following describes a numerical quantization scheme of a neural network decoder.

Parameters of a neural network model generally take up a huge storage space. Using L=5 as an example, a quantity of parameters currently used is about 800,000. If a neural network algorithm is to be deployed on a hardware chip, such data may need to be deployed or pre-deployed on an on-chip memory of an FPGA/ASIC because real-time error correction cannot withstand the latency caused by reading data from a main memory (a double data rate synchronous dynamic random access memory (DDR SDRAM) or a graphics double data rate SDRAM (GDDR SDRAM)). Since the parameters are of a floating-point type, each parameter may need to occupy 32-bit space, and it is difficult to use a lossless compression algorithm to compress the storage space thereof, the parameters occupy a large amount of valuable on-chip memory. In addition, the multiplication calculation of floating-point numbers consumes a large amount of computing resources and takes a long time. If other simple numerical types (for example, a fixed-point operation) may be used in the model for calculation without affecting the accuracy of the model, on-chip storage desirable is reduced (using 8-bit fixed-point as an example, storage is reduced by 4 times, and a greater calculation amount is reduced). In addition, the calculation speed is greatly increased, and computing resources consumed are greatly reduced. For an arithmetic operation chip of a real-time feedback fault-tolerant error correction system, a quantization operation is a method to compress an original network by reducing a quantity of bits desirable to represent each preset parameter and intermediate calculation result while improving storage efficiency and calculation efficiency.

Figure 16:
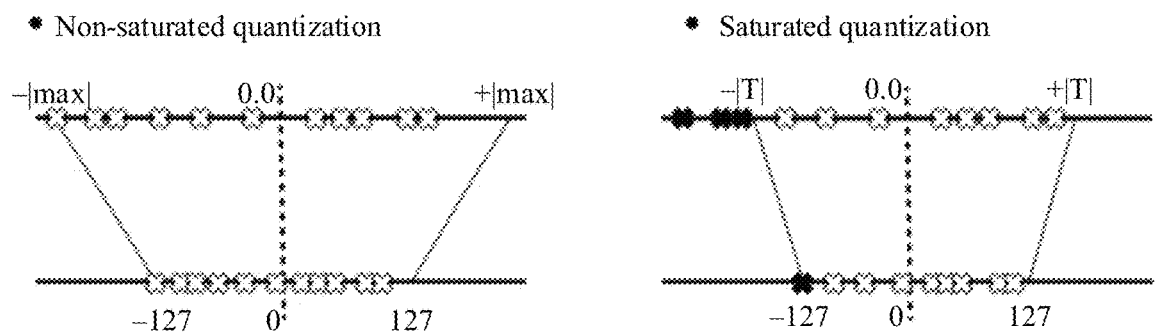
FIG. 16 is a schematic diagram of two quantification manners according to certain embodiment(s) of the present disclosure.

The prediction capability of a neural network has high robustness, and generally has low requirements for data precision. Decreasing the data precision through quantification has limited impact on the inference capability of a model. Generally, a quantization scheme is divided into non-saturated quantization and saturated quantization, as shown in FIG. 16. The non-saturated quantization is to map floating-point numbers in a specific range to a range that can be expressed by fixed-point numbers (in FIG. 16, 8-bit symbol fixed-point numbers are used as an example, and a range is integers from ~128 to 127). In response to determining there is uneven data distribution, for non-saturated mapping, it is likely to map a few data points to a relatively large range while mapping a large quantity of data points to a small range in which the data points cannot be distinguished, resulting in a large precision loss. For saturated mapping, some points with relatively large absolute values and relatively low statistical probabilities are uniformly mapped as boundary points (for example, −128 or 127 in FIG. 16). In this way, more fixed-point numbers in the range are used to represent data with a high probability. Under industrial/open source frameworks such as TensorFlow/pytorch/Tensor RT, a saturated quantization scheme is usually used to obtain better prediction precision. Such frameworks usually use different quantization manners for the weight, the output, the bias, and the like, and are more applicable to more flexible instruction set systems such as a CPU/GPU. The additional complexity prolongs the latency and often requires more computing resources. Input and output data types of an industrial/open source framework cannot be controlled, and the details cannot be fine-tuned according to specific may need to meet the may need.

In the technical solution of the present disclosure, the non-saturated quantization is directly selected because the non-saturated quantization is simple enough to implement, causes a negligible precision loss, and can satisfy the performance requirement. Next, the details of the non-saturated quantization scheme are specific ally described. In some other embodiments, the saturated quantization scheme is also applicable to the present disclosure, and it is likely that the quantization loss in response to determining there is a low error rate can be further reduced. Both the saturated quantization scheme and the non-saturated quantization scheme are within the protection scope of the present disclosure.

First, the present disclosure provides specific restrictions on the quantization scheme, that is, only unsigned fixed-point numbers are allowed to be inputted to a hardware multiplier. The reason for this choice is that multiplication is the most-executed operation in the entire model, and is to be simplified as much as possible to make full use of hardware resources. Therefore, once a type of unsigned fixed-point number with a specific quantity of bits is selected to represent a floating-point number in the model (including the input, the weight, the bias, the intermediate input and output data between layers, and the like), input data of the hardware multiplier may need to be unsigned fixed-point integers. Although output data of the multiplier and subsequent accumulation may produce an overflow that exceeds a representation range of fixed-point numbers, or that is negative, to enable subsequent multiplication operations to continue to use consistent unsigned fixed-point numbers, the present disclosure often requires a quantization algorithm to scale up, scale down, or truncate the output data to the range of unsigned fixed-point numbers.

While the design requirements of the quantization scheme are met, a calculation process of an output parameter of the hidden layer of the neural network decoder is as follows:
1. Obtain a quantized weight vector and a quantized input vector, the quantized weight vector including a weight parameter in a form of an unsigned fixed-point number obtained through numerical quantization, and the quantized input vector including an input parameter in the form of an unsigned fixed-point number obtained through numerical quantization; and
2. Obtain an output parameter in the form of an unsigned fixed-point number based on an inner product of the quantized weight vector and the quantized input vector. In certain embodiment(s), the output parameter is an unsigned fixed-point number belonging to a fixed value range.

Next, the present disclosure provides a specific quantization protocol.

In consideration of a floating-point number $x_f$ and an unsigned fixed-point number representation $x_q$ thereof, a fixed-point number representation range is $[q_{min}, q_{max}]$. In addition, in consideration of a statistical value range $[x_{min}, x_{max}]$ of $x_f$, a scaling coefficient is defined as $scale_x$:

$$scale_x = \frac{x_{max} - x_{min}}{q_{max} - q_{min}}$$

If $[x_{min}, x_{max}]$ includes a 0 point, a fixed-point number $x_0$ corresponding to 0 is:

$$x_0 = q_{min} - \frac{x_{min}}{scale_x}$$

If $x_{min} > 0$, $x_0 = q_{min}$ is set; and if $x_{max} < 0$, $x_0 = q_{max}$ is set. $x_0$ may be referred to as a reference fixed-point number.

In any embodiment, there are the following general non-saturated mapping (quantization) rules:

$$x_q = x_0 + \frac{x_f}{scale_x}$$

$$x_f = (x_q - x_0)scale_x$$

The issue of using a neural network for inference is described below. According to the model parameters described above in the present disclosure, only convolutional layers, fully connected layers, and ReLU layers are allowed to be used. Therefore, a core arithmetical operation of either convolution or multiplication of a matrix and a vector is an inner product of two vectors w and a:

$$\sum_i w[i]a[i]$$

where i is a positive integer, representing a quantity of elements in the vector w/vector a; w[i] is a weight parameter in the form of a floating-point number, and a[i] is an input parameter in the form of a floating-point number.

Therefore, the next focus is on how to use the non-saturated quantization rules to approximate this vector inner product operation by using a fixed-point operation. First, the relationship between w and a fixed-point number $q_w$ thereof and the relationship between a and a fixed-point number $q_a$ thereof are as follows:

$$w[i] = (q_w[i] - w_0)gscale_w$$

$$a[i] = (q_a[i] - a_0)gscale_a$$

where $q_w$ is the weight parameter in the form of an unsigned fixed-point number obtained through numerical quantization, $q_a$ is the input parameter in the form of an unsigned fixed-point number obtained through numerical quantization, $scale_w$ is a scaling coefficient corresponding to the weight parameter, $scale_a$ is a scaling coefficient corresponding to the input parameter, $w_0$ is a reference fixed-point number corresponding to the weight parameter, $a_0$ is a reference fixed-point number corresponding to the input parameter.

A result of an inner product of the vectors w and a is denoted as O, and there is a correspondence between O and quantization $O_q$ thereof:

$$O = (O - O_q) scale_O \qquad 5$$

$scale_O$ is the scaling coefficient corresponding to the output parameter.

In addition, the expression of O is as follows:

$$O = \sum_i w[i]a[i] + b$$
$$= \sum_i scale_w scale_a g(q_w[i] - w_0)(q_a[i] - a_0) + b$$

where b is the bias parameter in the form of a floating-point number.

For convenience, n-bit (n is a positive integer) fixed-point numbers are used, so that $q_{min}=0$, and $q_{max}=2n$. Because a value of a is either a syndrome (a first layer of network) or an output result of a calculation result of a previous layer after the ReLU, according to the previous mapping rules, there are $a_0=0$ and $O_0=0$. After the above formula is transformed, the relationship between $O_q$ and $q_w$ and the relationship between $q_a$ and $q_b$ may be obtained:

$$O_q = \underbrace{\frac{scale_w scale_a}{scale_O}}_{S_1}\left(\underbrace{\sum_i q_w[i]q_a[i]}_{A} - \underbrace{w_0 \sum_i q_a[i]}_{B}\right) + \underbrace{\frac{scale_b}{scale_O}(q_b - b_0)}_{S_2}$$

where $q_w$ is the weight parameter in the form of an unsigned fixed-point number obtained through numerical quantization, $q_a$ is the input parameter in the form of an unsigned fixed-point number obtained through numerical quantization, $q_b$ is a bias parameter in the form of an unsigned fixed-point number obtained through numerical quantization $scale_w$ is a scaling, coefficient corresponding to the weight parameter, $scale_a$ is a scaling coefficient corresponding to the input parameter, $scale_O$ is a scaling coefficient corresponding to the output parameter, $scale_b$ is a scaling coefficient corresponding to the bias parameter, $w_0$ is a reference fixed-point number corresponding to the weight parameter, $b_0$ is a reference fixed-point number corresponding to the bias parameter, and i is a positive integer.

After the ReLU, $O_q$ is used as an input $q_a$ of a next layer for a next round of calculations.

Quantities in this expression are analyzed below:

1.

$$S_1 = \frac{scale_w scale_a}{scale_O}$$

depends on the scaling coefficients of w, a, and O. $scale_w$ is the scaling coefficient of the weight parameter of the model. Once the model is given (training is performed), both $w_{max}$ and $w_{min}$ are specific numbers. However, $scale_a$ and $scale_O$ depend on a maximum (minimum) value of the output layer, and the values are different for different inputs. Therefore, the algorithm may be run on one test sample set, to acquire a maximum (minimum) value outputted in each layer to calculate a statistical average, and finally obtain $scale_a$ and $scale_O$. An error rate of a test sample herein may need to be consistent with an error rate of an actual qubit, to ensure that the quantized model can be optimal under an actual error rate. $S_1$ is generally a floating-point number, and may be less than 1. To make operations a fixed-point number, $S_1$ may need to be multiplied by a power of 2 (the specific reason is described in detail later), and set to m, to approximate a positive integer $\tilde{S}_1$. $\tilde{S}_1$ does not need to be restricted to [qmin, qmax]. Because there is only one operation (multiplication) for $\tilde{S}_1$, a special adjusted multiplier may be customized.

2.

$$S_2 = \frac{scale_b}{scale_O}(q_b - b_0)$$

is similar to $S_1$. $scale_O$ may need to be obtained by running the model on a test sample set. $S_2$ is also a floating-point number, but is generally much larger than 1, and therefore, is directly truncated, to remove the decimal part and obtain an approximate integer $\tilde{S}_2$.

3.

$$A = \sum_i q_w[i]q_a[i]$$

is an MA operation of fixed-point numbers, and is the core part of the whole model with the largest calculation amount. Both $q_w$ and $q_a$ are desirable to be within [0, 2n]. The calculation amount of A is the largest among steps, so that multiplications are desirable to use a consistent multiplier. Generally, A overflows the expression range [0, 2n] of unsigned fixed-point numbers, so that the range of A is not restricted.

4.

$$B = w_0 \sum_i q_a[i]$$

is a sum operation of fixed-point numbers, and is finally multiplied by $w_0$. Similarly, B also overflows [0, 2n], so that the range of B is not restricted either.

In actual calculations, both A and B are positive integers, but a difference therebetween may be a negative number. To deal with this situation, after A and B are obtained, A and B are uniformly filled with 0 to extend to a fixed length (depending on the specific situation), and then are subtracted as two signed integers to obtain A−B. A result obtained is multiplied by $\tilde{S}_1$ to obtain a signed integer $\tilde{S}_1(A-B)$. Since this result is scaled up by 2m times, the result obtained may need to be right-shifted by m (m is a positive integer) bits at a bit operation level, to obtain an approximation of $\tilde{S}_1(A-B)$. The result obtained is then added to $\tilde{S}_2$ with signed numbers, to obtain a signed integer approximation of $\tilde{S}_1(A-B)+S_2$.

In addition, an activation function layer may be further included after each hidden layer of the neural network decoder. The activation function layer may use the ReLU activation function according to the model design parameters above, and may be configured to process the output parameter of the hidden layer as follows: obtaining a sign bit of the output parameter; maintaining values of bits of the output parameter unchanged when or in response to determining that the sign bit indicates that the output parameter is a positive number; and setting the values of the bits of the output parameter to zero when or in response to determining that the sign bit indicates that the output parameter is a negative number.

In an example, it is assumed that A=4, and B=8, which are A=00000100 and B=00001000 respectively expressed in 8-digit binary. A−B<0. However, the two are unsigned numbers, and numbers that may need to be processed subsequently are larger than the 8-bit representation range, so that the two numbers are first expanded to signed numbers of bits represented by more bits. Using the expansion to 16 bits as an example, A=0000000000000100, and B=0000000000001000. A and B are no longer unsigned numbers herein, but are considered as two's complements with signed representation, and the first bit is a signed number (0 is positive, and 1 is negative). In this way, A−B=−4 is represented as 1111111111111100, which is a signed number. Then, the ReLU layer only may need to determine the output according to whether the first bit is 0 or 1. If the first bit is 0, it means that the result is greater than 0, and an original result is retained. If the first bit is 1, it means that the result is less than or equal to 0, and bits are reset to 0.

L=5 is used as an example to observe the effect of the quantification scheme. A standard 8-bit fixed-point quantization scheme is selected. There are a total of six models, and each model has a total of four layers, including one convolutional layer and three fully connected layers. For the convolutional layer, m=8 is set, and for the fully connected layer, m=16 is set. The setting of m has a specific degree of arbitrariness, and a specific value thereof depends on the performance loss. In addition, for different physical error rates, statistical properties of input and output layers are different, so that $S_1$ and $S_2$ may need to be determined by using a specific error rate.

Figure 17:
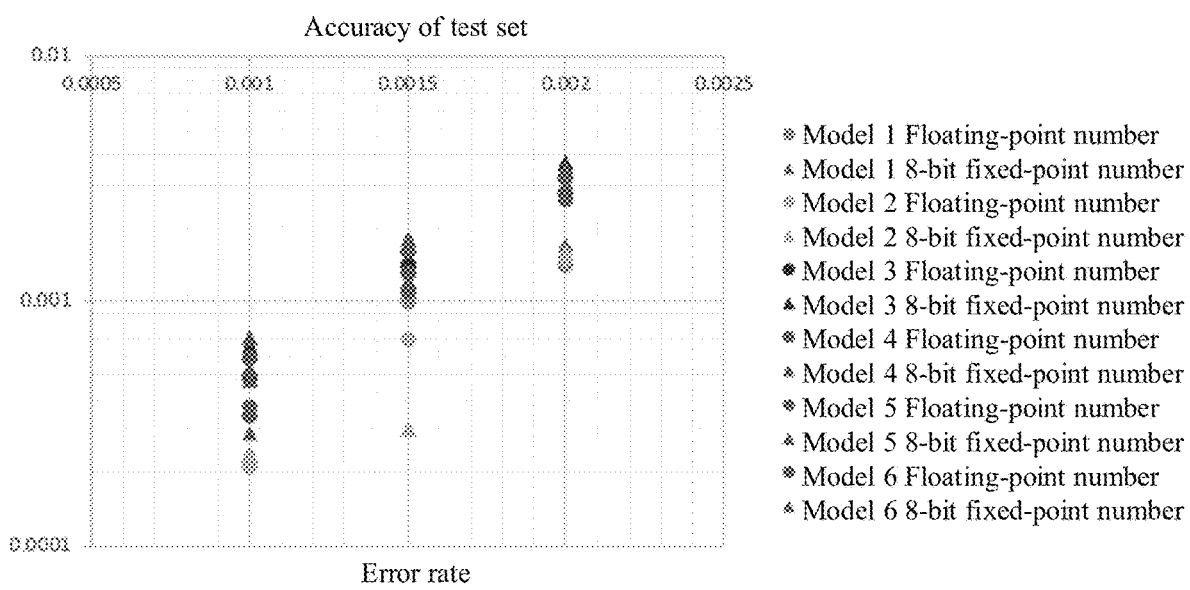
FIG. 17 is a schematic diagram of precision loss comparison between 8-bit fixed-point numbers and 32-bit floating-point numbers according to certain embodiment(s) of the present disclosure.

To quantitatively test the impact of quantification, three calibration data sets are selected, corresponding to p=0.001, 0.0015, and 0.002 respectively, and a sample set size is 20000, to determine values of $S_1$ and $S_2$. Correspondingly, three test sets with a scale of about 40,000 are also selected. Test results are shown in FIG. 17. Compared with 32-bit floating-point numbers, predicted precision losses of 8-bit fixed-point numbers are small for six models, and the error rate increases by 10% on average, which is within an acceptable range. When p is relatively small, the error rate precision loss is relatively large, which may be related to the fewer non-zero sample points that may be obtained in this embodiment and a relatively large variance of $S_1$ and $S_2$. Therefore, saturated quantization may be used for improvement subsequently when the value of p is relatively small.

Based on the above, according to the technical solution provided in the embodiments of the present disclosure, for the system that uses the neural network decoders for QEC decoding, normalization is performed on the neural network decoders, so that the core operation of the neural network decoders is the MA operation of unsigned fixed-point numbers obtained through numerical quantization, thereby minimizing the data volume and the calculation amount desirable by the neural network decoders, so as to better meet the requirement of real-time error correction.

In addition, the neural network decoders may simulate any fault-tolerant error correction decoding algorithm and approximate the performance of an original decoder after the model structure is adjusted, and operations are matrix operations, which is suitable for large-scale parallelization.

The following describes a running process of neural network decoders on hardware chips (for example, FPGAs/ASICs).

After a quantization scheme is determined, the neural network decoders may be deployed onto the FPGAs/ASICs respectively. To maximize the use of hardware resources, for each FPGA/ASIC, only one neural network decoder is allowed to be deployed at most. Since the neural network decoders have the same structure, after the deployment of one model is performed, the deployment of other models may also be performed in the same manner.

Figure 18:
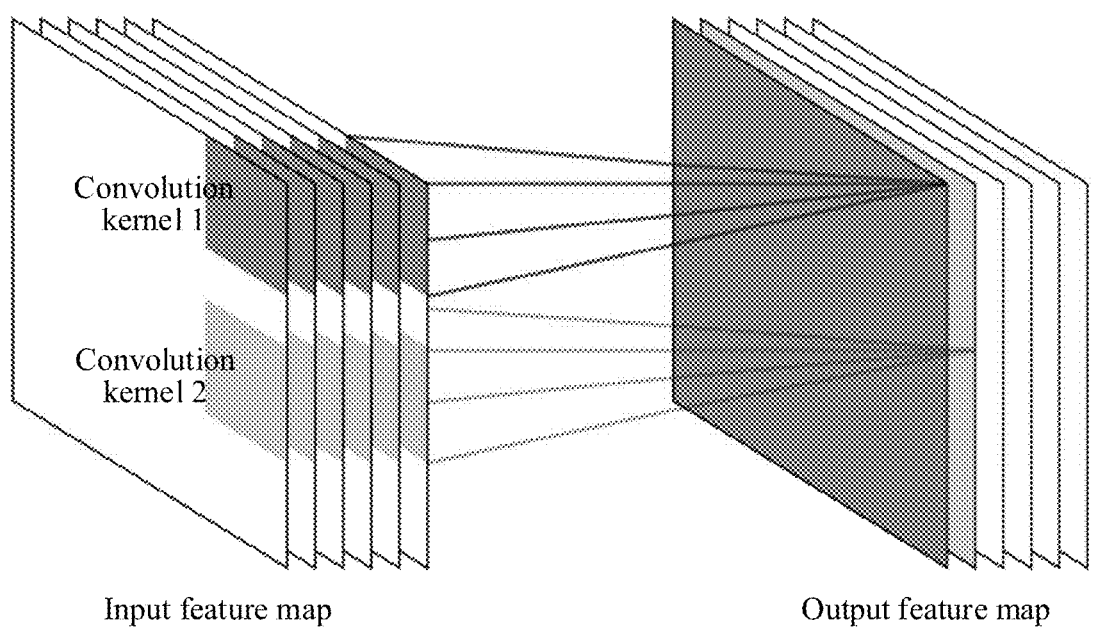
FIG. 18 is a schematic diagram of convolution calculation according to certain embodiment(s) of the present disclosure.

According to model parameters, each model has only a three-dimensional convolutional layer and a fully connected layer, and operation rules thereof are shown in FIG. 18. Since the core of the two operations is an inner product of vectors, and input data may need to be applied repeatedly a large quantity of times, the parallelism may be maximized by copying the input data and model parameters in batch for MA. If available computing resources are unlimited, the multiplication of each three-dimensional convolutional layer and fully connected layer may be performed within one multiplication cycle, and model inference may be performed within K (K is a positive integer) multiplication calculation cycles at the fastest, where K is a quantity of layers of the model.

However, in reality, computing resources, especially, expensive multiplication computing resources, are limited. Using an FPGA as an example, an on-chip digital signal processor (DSP) may generally provide thousands of 8-bit fixed-point calculators, that is, up to thousands of 8-bit multiplication operations may be performed simultaneously. In consideration of the wiring restrictions, the resources for simultaneous multiplication operations are further reduced. However, the neural network decoders require millions of 8-bit multiplication operations. Since a total calculation amount is fixed, and calculation types are also fixed, to shorten the calculation time, the on-chip computing resources may need to be used simultaneously as much as possible.

On the other hand, the versatility of the computing architecture may need to be considered. That is, the architecture may need to realize different architecture models. This is especially important when ASICs are used. If only one structure of the model can be realized, once the system may need to be switched (for example, the structure, hyperparameters, and the like of the model are changed according to specific noise requirements), according to a new system/noise model, the front end and back end may need to be updated and taped out again, which is expensive in terms of time and material costs. A universal full-multiplexed parallel operation architecture is provided in the present disclosure below to speed up the inference operation of the model. For example, when there are enough available on-chip memories, the architecture may be parallelized and accelerated to run any model as specified above.

First, the entire calculation process may be decomposed into a plurality of inner products of vectors. The quantized inner product operation is given above:

$$O_q = \underbrace{\frac{scale_w scale_a}{scale_O}}_{S_1} \left( \underbrace{\sum_i q_w[i] q_a[i]}_{A} - \underbrace{w_0 \sum_i q_a[i]}_{B} \right) + \underbrace{\frac{scale_b}{scale_O}(q_b - b_0)}_{S_2}$$

$S_1$, $S_2$, $q_w$, and $w_0$ are determined values after the model is given (training performed), and $S_1$ and $S_2$ are calibrated through the test sets, and are not related to the specific input. The values may need to be stored or pre-stored in an on-chip memory to facilitate fast reading from a corresponding location in the on-chip memory when inner products are desirable (the latency in one clock cycle is several nanoseconds). The calculations of A and B are independent of each other and may be performed simultaneously. A includes the largest number of multiplications and occupies the main computing resources. Compared with A, the calculation amount of B is negligible. Since operations of a layer cannot be performed in one cycle, only some inner product operations can be performed simultaneously, and even only some multiplications and accumulations of the inner product operations can be performed simultaneously. The inner product calculation may include three steps, that is, reading parameters from a data memory (read, "R" for short), MA, and quantization ("Q" for short). Therefore, the three steps may be pipelined, and output results of layers may be stored in an on-chip register, as shown in FIG. 19.

Figure 19:
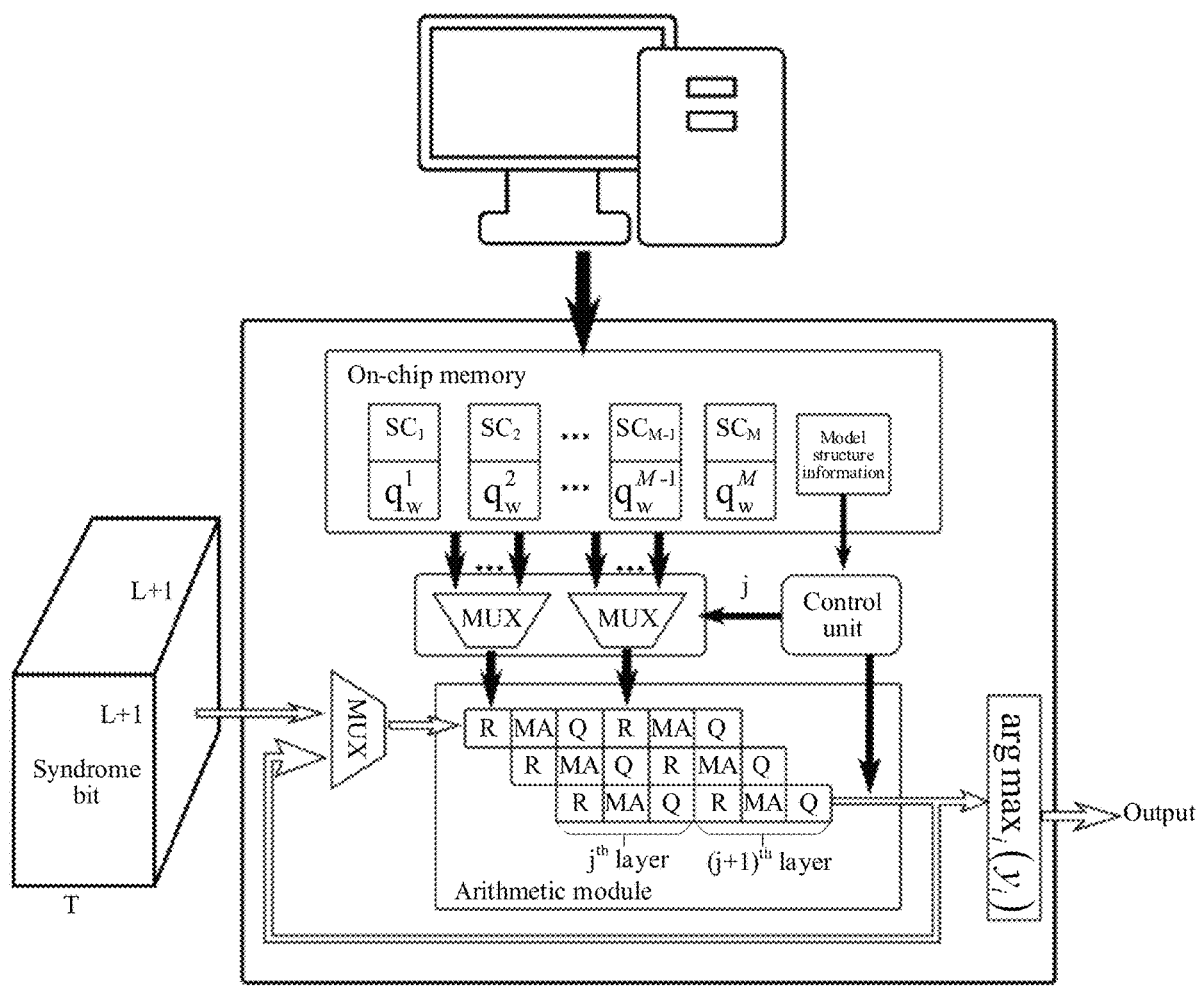
FIG. 19 is a schematic diagram of an architecture of an error correction chip according to certain embodiment(s) of the present disclosure.

In an exemplary embodiment, as shown in FIG. 19, an entire architecture of an error correction chip includes: an on-chip memory, a control unit, and an arithmetic module.

The on-chip memory is configured to store parameter information of the neural network decoder, including the predetermined parameters above (for example, including $S_1$, $S_2$, $q_w$, and $w_0$, and the like, where in FIG. 19, SC represents predetermined parameters other than $q_w$, for example, $S_1$, $S_2$) and model structure information (Model Specs, including various hyperparameters of the model). Such data are static, and therefore may be loaded into the on-chip memory from a personal computer (PC) before an entire QC process starts.

The control unit is configured to control the arithmetic module to read the parameter information from the on-chip memory.

The arithmetic module is configured to read the parameter information (that is, R) from the on-chip memory, execute the MA operation (that is, MA) based on the parameter information, and calculate an output parameter (that is, Q) of a hidden layer of the neural network decoder based on a result of the MA operation. For example, when the inner product operation is performed to obtain the output parameter, the predetermined parameters are obtained from the on-chip memory. The predetermined parameters refer to the parameters of which values are not affected by an input parameter, for example, including $S_1$, $S_2$, $q_w$, and $w_0$. The output parameter in the form of an unsigned fixed-point number is obtained based on the predetermined parameters as well as an inner product of a quantized weight vector and a quantized input vector.

The three parts R, MA, and Q in the arithmetic module are executed in a pipeline manner. Data is read from the memory and an output of an upper level for MA and is quantized and outputted, and an outputted result is stored in an on-chip register. The arithmetic module may need to make full use of on-chip multiplication and addition resources, which often requires the fan-out of output data of a previous layer to be copied to different multiplication units and addition units in the module. Due to the pipeline structure of reading, the latency caused by reading from the on-chip memory is negligible. Model structure parameters (a quantity of layers, a weight of each layer, a quantity of biases, and the like) in the memory are initialized to the control unit, to determine a calculation cycle of each layer of the model network. After the calculation of one layer of the network is performed, a multiplexer (MUX) is instructed to select data of a corresponding network layer from a plurality of memory channels and transmit the data to the arithmetic module, and switch an output register to an input register of the next layer. Since models are shallow, the complexity of a control circuit itself does not increase rapidly as the complexity of a model increases, so that the control circuit is suitable for large models. On the other hand, in response to determining there is a relatively simple model, such a fully-multiplexed architecture may bring additional complexity while bringing limited benefits. Therefore, in consideration of the specific situation, a practical architecture used is modified based on FIG. 19 according to local conditions. For example, arithmetic operations of up to two levels of network may be connected in series into a pipeline, which can reduce the latency caused by data waiting between layers (an input of the next layer may need to wait for a calculation result of the previous layer, and in this embodiment, calculation cannot be performed, resulting in a waste of on-chip computing resources). However, due to the dependence of data, only pipelines of two layers of networks can be stringed at a time to form a longer pipeline, as shown in FIG. 19. The specific allocation of computing resources to parts of the pipeline also may need to be adjusted according to the hyperparameters of different models, but the specific allocation of the resources is also determined by the control unit and is programmable.

Figure 20:
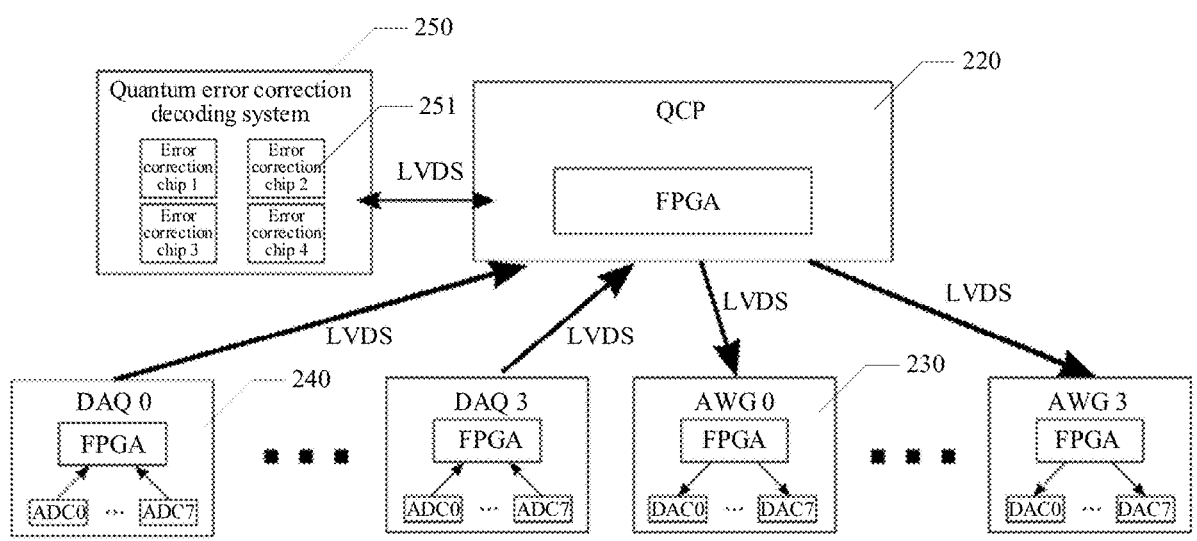
FIG. 20 is a schematic diagram of an FTQEC system according to certain embodiment(s) of the present disclosure.

As shown in FIG. 20, an exemplary embodiment of the present disclosure further provides an FTQEC system. The FTQEC system includes: a quantum circuit, a QCP 220, an AWG 230, a DAQ unit 240, and a QEC decoding system 250 including a plurality of error correction chips 251.

The AWG 230 is configured to transmit a measurement waveform for error syndrome measurement to the quantum circuit.

The DAQ unit 240 is configured to acquire the measurement waveform amplified by the quantum circuit, demodulate the acquired measurement waveform to obtain error syndrome information of the quantum circuit, and transmit the error syndrome information to the QCP 220, the error syndrome information being a data array formed by eigenvalues of a stabilizer generator of a QEC code.

The QCP 220 is configured to transmit the error syndrome information to the plurality of error correction chips 251 in the QEC decoding system 250.

The error correction chips 251 are configured to decode the error syndrome information by running neural network decoders, to obtain error result information, the error result information being used for determining a qubit in which an error occurs in the quantum circuit and a corresponding error type, and a core operation of the neural network decoders being a MA operation of unsigned fixed-point numbers obtained through numerical quantization.

In an exemplary embodiment, the error correction chips 251 are further configured to transmit the error result information to the QCP 220.

The QCP 220 is further configured to transmit an error correction instruction to the AWG 230 based on the error result information, the error correction instruction including location information of the qubit in which the error occurs and the corresponding error type.

The AWG 230 is further configured to transmit an error correction waveform to the quantum circuit based on the error correction instruction, the error correction waveform being used for correcting the qubit in which the error occurs in the quantum circuit.

In certain embodiment(s), at least one of the following communication processes uses LVDS:

1. Communication between the QCP and the AWG. In certain embodiment(s), the communication is between a hardware chip (for example, an FPGA) of the QCP and a hardware chip (for example, an FPGA) of the AWG.
2. Communication between the QCP and the DAQ unit. In certain embodiment(s), the communication is between a hardware chip (for example, an FPGA) of the QCP and a hardware chip (for example, an FPGA) of the DAQ unit.
3. Communication between the QCP and the error correction chips. In certain embodiment(s), the communication is between a hardware chip (for example, an FPGA) of the QCP and an error correction chip (for example, an FPGA).

In this embodiment of the present disclosure, the LVDS standard is used to reduce the latency of the entire signal transmission link of the system. Because the entire error correction system has high requirements for the latency, it is almost impossible to use any existing high-speed communication protocol framework for data transmission. This is because although such protocols can reach a high data rate (the high-speed SerDes protocol can be used to reach a speed above 20 Gbps), the communication protocol of data may need to be converted at a transmit end and a receive end during transmission. If an amount of the data transmitted is large, the overheads of the protocol layers become negligible. However, for QEC, a single time of data transmission in the order of tens of bits, the protocol overheads of hundreds of nanoseconds are unacceptable. Therefore, this embodiment of the present disclosure uses the LVDS standard for signal transmission, which can achieve a relatively high rate and allow a plurality of simultaneous transmissions without causing an additional latency at the protocol layers, so that the signal transmission latency of an entire feedback link can meet the requirements.

A quantity of LVDS channels and a rate used in each step are exemplarily described below:

1. From an analog to digital converter (ADC) of the DAQ unit to an FPGA of the DAQ unit: The ADC converts the measurement waveform returned by the quantum circuit into a digital signal, and sends the digital signal to the FPGA for processing to obtain a measurement result of the qubit. The parameters of the ADC used in this system are 12-bit resolution and a data rate of 1 Gbps. Therefore, from each ADC to the FPGA, 12 pairs of LVDS channels are used and run at 500 MHz, 5 points are transmitted each time, and a single transmission often requires 5 ns.
2. From an FPGA of the DAQ unit to an FPGA of the QCP: A data size of a single transmission of an FPGA of each DAQ unit is 40 bits, which includes the following parts: One FPGA produces four sets of measurement results, each set of measurement results includes 8 qubits, and a state of each qubit may be represented by 1 bit (after each qubit is measured, there are only two different states of 0 and 1). In addition, each transmission often requires an 8-bit transmission header to indicate an effective operation and the like, that is:

40 bits=8 bits (header)+8 (qubits)×4 (group)×1 (bit)

From the FPGA of each DAQ unit to the FPGA of the QCP, 8 pairs of LVDS channels are used, a transmission clock frequency is 200 MHz, and a single transmission often requires 15 ns.

3. Two-way transmission between an FPGA of the QCP and error correction chips: The two transmissions are basically the same as above.
4. From an FPGA of the QCP to an FPGA of the AWG: Data sent from the QCP to the AWG is a waveform selection code, which instructs the AWG to select from the storage and send a specific waveform (quantum operation). A data size of a single transmission from the FPGA of the QCP to the FPGA of each AWG is 48 bits, which includes the following parts: The FPGA of each AWG has 8 analog channels, each channel stores 32 types of waveforms, that is, a 5-bit waveform selection code, and similarly, an 8-bit transmission header is desirable for each transmission, that is:

48 bits=8 bits (header)+8 (channel)×5 (bits)

From the FPGA of the QCP to the FPGA of each AWG, 8 pairs of LVDS channels are used, a transmission clock frequency is 200 MHz, and a single transmission often requires 15 ns.

5. From an FPGA of the AWG to a DAC of the AWG: The AWG sends error correction waveform data to the DAC for converting the data into an analog waveform (that is, an error correction waveform), which finally acts on the quantum circuit. The parameters of the DAC used in this system are 16-bit resolution and a transmission rate of 2 Gbps. Therefore, from the FPGA to each DAC, 32 pairs of LVDS channels are used and run at 500 MHz, and 10 points are transmitted each time, which often requires 10 ns.

A few additional explanations: First, it may be seen that in this system, measurement results are transmitted back to the QCP first, and are then transmitted from the QCP to the error correction chips. Apparently, directly transmitting the measurement results to the error correction chips may reduce some time, which, however, often requires additional 32 pairs of LVDS connection lines for the FPGA of each DAQ unit, resulting in insufficient pin resources of the currently used FPGA. In addition, the frequency of LVDS of data transmission between FPGAs in this system is lower than the frequency of LVDS between DA/AD and the FPGAs. This is because in hardware implementation, due to a physical distance between different modules, the printed circuit board (PCB) wiring between the FPGAs is relatively long, and if the frequency is too high, such as when data misalignment may occur. Therefore, 200 MHz that is conservative is currently used.

Meanwhile, the time calculated above is a time desirable for digital logic to transmit LVDS data. The actual signal transmission time on the PCB wiring is not counted. However, after actual calculations, it takes only 2 to 3 ns transmit data between the farthest FPGAs through the wiring, which, therefore, is included in logical time consumption of the receive end and does not need to be calculated individually.

It may be found that a quantity of analog channels (AWG and DAQ modules) desirable by a measurement and control system increases linearly with an increase in a quantity of bits included in the quantum circuit, and the increase in the quantity of analog channels also means an increase in a quantity of LVDS transmission lines. The existing measurement and control system uses an FPGA to implement digital logic of each module. However, the FPGA can only provide a limited quantity of pins, which leads to a limited quantity of analog channels that may be controlled by an FPGA corresponding to one QCP. Meanwhile, a quantum instruction set run on the QCP also faces the problem of a quantum instruction processing speed. Therefore, when a quantity of qubits that may need to be controlled increases, the control capability of the QCP faces a bottleneck.

When the quantity of qubits is not particularly large (about tens or hundreds of bits), a central architecture may be used for control. When more qubits may need to be controlled (about hundreds to thousands), a scalability problem faced by the QCP may need to be resolved architecturally. The architecture design herein involves content related to the quantum instruction set.

A specific example is given below to describe the technical solutions of the present disclosure.

L=5 is used as an example, to implement an FTQEC system based on a neural network decoder, and calculate a decoding latency. The specific requirements are as follows:

At present, a real-time feedback error correction algorithm with L=5 has a total of six neural network decoders, and each decoder includes four hidden layers (also referred to as a matrix multiplication network):

The first layer of matrix is convolution of 500 6×4×3 matrices and one 10×4×3 matrix. The 10×4×3 matrix is a state determination result (input syndrome bit), the state being 0 or 1. The 6×4×3 matrix is a weight.

The second layer of matrix is a product of one 2000×400 matrix and one vector of 2000.

The third layer of matrix is a product of one 400×80 matrix and one vector of 400.

The fourth layer of matrix is a product of one 80×64 matrix and one vector of 64 (or 2).

A calculation result of each layer may need to be quantized and truncated, and processed into 8-bit unsigned fixed-point data.

outweigh the losses. Therefore, the example of this implementation does not follow the full-multiplexing scheme described above, but uses a scheme in which each layer of matrix operation has a respective dedicated circuit.

Figure 21:
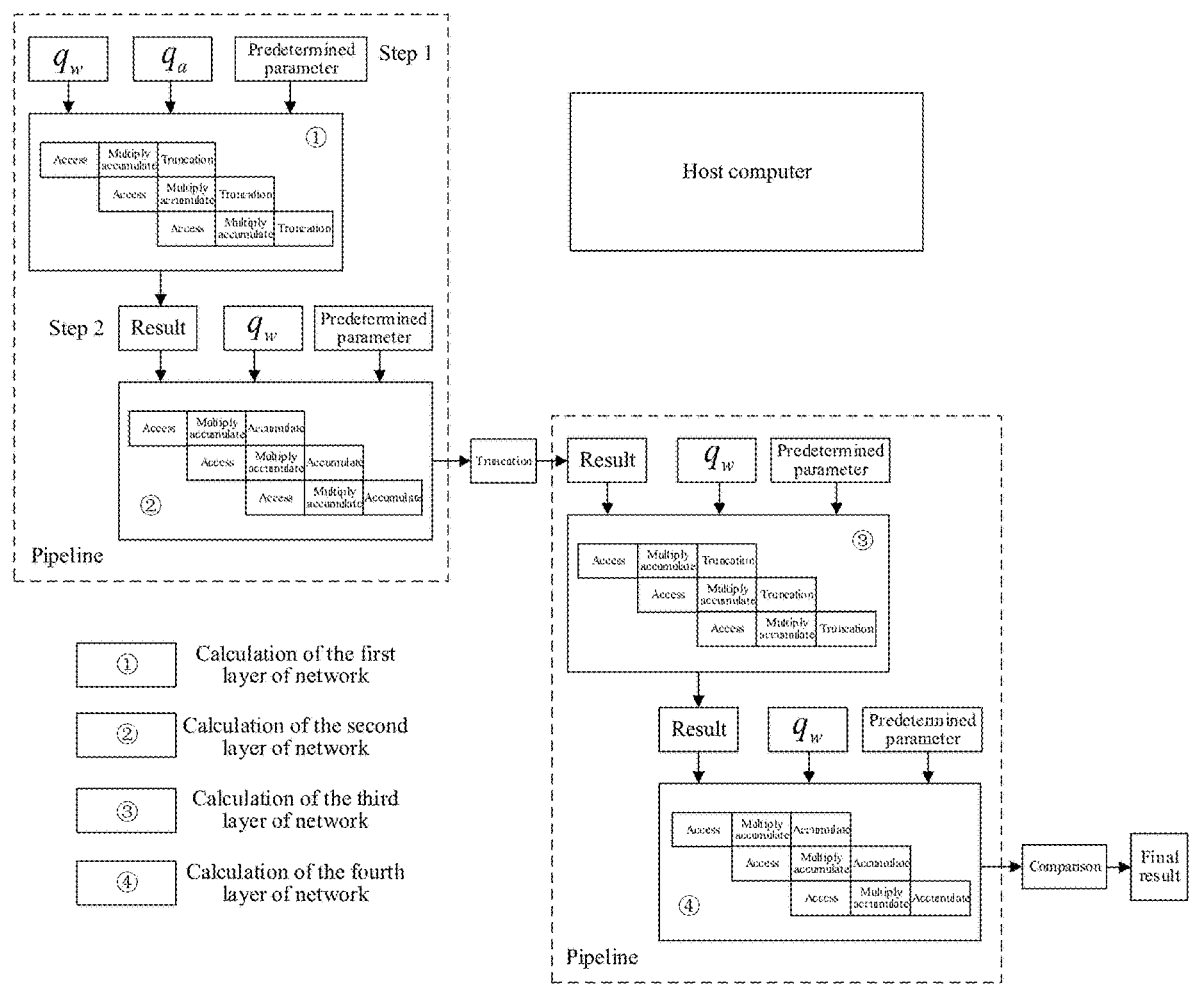
FIG. 21 is a schematic diagram of a QEC decoding process according to certain embodiment(s) of the present disclosure.

A block diagram of the solution is shown in FIG. 21. An input of each layer of network includes three parts:
1. A calculation result of a previous layer of network (a corresponding input of the first layer of network is a state determination result of a qubit);
2. A weight parameter (configured through a PC); and
3. Quantized and truncated data (configure through the PC).

The weight parameter and the quantized and truncated data are configured to on-chip storage resources through the PC before the calculation is started. After the state determination result is received, the calculation is started.

The calculation processes of the first layer of network and the second layer of network form pipeline processing.

The calculation processes of the third layer of network and the fourth layer of network form pipeline processing.

Since each FPGA chip supports up to 11520 INT8 multiplications at a time, and each neural network decoder has a total of 1.2 M multiplications, it is desirable to consider allocating the 11520 INT8 multiplications to the four layers of network, or in other words, consider a quantity of calculations for each layer of network in each clock cycle. The distribution processes are as follows:
1. A utilization rate of DSP IP core resources is the largest.
2. A total calculation latency is the smallest.
3. The FPGA chips are routed through.

The available allocation policies are shown in Table 1 below. The data in the table are estimated values.

TABLE 1

|  |  | First layer of network | Second layer of network | Third layer of network | Fourth layer of network | Total |
|---|---|---|---|---|---|---|
| Scheme 1: | Quantity of multiplications per clock cycle | 896 | 6400 | 3200 | 512 | 11008 |
|  | Quantity of multiplier IP cores | 0 | 3200 | 1600 | 256 | 5056 |
|  | Quantity of clock cycles | 146 | 0 | 34 | 0 | 213 |
|  | Time (ns) | 730 | 0 | 170 | 0 | 1065 |
| Scheme 2: | Quantity of multiplications per clock cycle | 1120 | 8000 | 1600 | 256 | 10976 |
|  | Quantity of multiplier IP cores | 0 | 4000 | 800 | 128 | 4928 |
|  | Quantity of clock cycles | 121 | 0 | 44 | 0 | 198 |
|  | Time (ns) | 605 | 0 | 220 | 0 | 990 |

The implementation solution is as follows:

An Intel Stratix 10 series FPGA chip is used to implement a neural network algorithm, where the FPGA chip includes 5760 DSP intellectual property (IP) core (multiplier IP core) resources and supports up to 11520 INT8 (8-bit integer) multiplications.

Each FPGA chip may implement one neural network decoder. The whole system has a total of six neural network decoders, and six FPGA chips may be needed Since L=5, the neural network decoder has only four layers, and a calculation amount of the last two layers is small. In the scheme described above is used, a more complex control circuit is used, which consumes on-chip resources without bringing more parallelism. Under the current circumstances, the gains According to the three processes, the allocation policy specified in Scheme 2 is finally used.

In the first layer of network, since data of the 10×6×3 matrix is 1 bit, the multiplication operation may be implemented using ordinary logic resources without using DSP IP cores. Since the calculation process of the second layer of network and the calculation process of the first layer of network form pipeline processing, a calculation time at the second layer of network may be considered as zero. The calculations of the third layer of network and the fourth layer of network are the same as the above.

Finally, a calculation time of the entire network model is 1010 nanoseconds.

This implementation has been verified on an actual board.

A specific verification method is: inputting the same data and parameters into the circuit and a PC program respectively, and comparing outputs of the two. It is found through actual measurement that the outputs of the two are consistent.

In summary, fault-tolerant error correction is the only way to large-scale general QC, and is a basic technology. The technical solutions provided in the present disclosure enable a shallow neural network fault-tolerant decoding algorithm to be deployed in a high-speed feedback control system with an FPGA, to implement real-time fault-tolerant decoding (a total latency of about 1.2 µs (microseconds)), and if the FPGA is replaced with the latest FPGA adjusted for neural network operators, the latency is expected to be reduced to about 700 ns). The latency is about 10,000 times less than that of a known MWPM decoder solution (single-core 3.7 GHz Intel Xeon CPU), and is about 20 times or more less than that of the adjusted MWPM decoder, so that the requirements of real-time error correction are met, which is of large technical significance.

In addition, an exemplary embodiment of the present disclosure further provides a QEC decoding method. The method is performed by error correction chips, and the method may include the following steps:
1. Obtain error syndrome information of a quantum circuit, the error syndrome information being a data array formed by eigenvalues of a stabilizer generator of a QEC code; and
2. Decode the error syndrome information by running neural network decoders, to obtain error result information, the error result information being used for determining a qubit in which an error occurs in the quantum circuit and a corresponding error type, and
a core operation of the neural network decoders being a MA operation of unsigned fixed-point numbers obtained through numerical quantization.

For details not described in the method embodiments, reference may be made to the descriptions in the other embodiments, and details are not described herein again.

Figure 22:
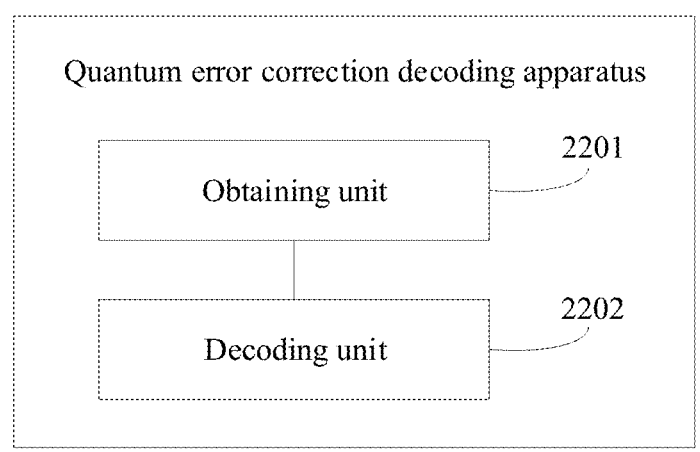
FIG. 22 is a schematic diagram of a QEC decoding apparatus according to certain embodiment(s) of the present disclosure.

In addition, an exemplary embodiment of the present disclosure further provides a QEC decoding apparatus. Referring to FIG. 22, the apparatus includes:
an obtaining unit 2201, configured to obtain error syndrome information of a quantum circuit, the error syndrome information being a data array formed by eigenvalues of a stabilizer generator of a QEC code; and
a decoding unit 2202, configured to decode the error syndrome information by running neural network decoders, to obtain error result information, the error result information being used for determining a qubit in which an error occurs in the quantum circuit and a corresponding error type, and
a core operation of the neural network decoders being a MA operation of unsigned fixed-point numbers obtained through numerical quantization.

When the apparatus provided in the embodiments implements functions of the apparatus, the division of the functional units is merely an example for description. In the practical implementation, the functions may be assigned to and performed by different functional units according to the requirements, that is, the internal structure of the device is divided into different functional units, to implement all or some of the functions described above. In addition, the apparatus and method embodiments provided in the embodiments belong to the same conception. For the specific implementation process, reference may be made to the method embodiments, and details are not described herein again.

In addition, an exemplary embodiment of the present disclosure further provides an error correction chip, and the error correction chip is configured to implement the QEC decoding method.

In addition, an exemplary embodiment of the present disclosure further provides a non-transitory computer-readable storage medium, storing at least one computer program, the at least one computer program being loaded and executed by a processor of a computing device to cause the computer to implement the QEC decoding method.

In certain embodiment(s), the non-transitory computer-readable storage medium may be a read-only memory (ROM), a random access memory (random-access memory, RAM), a compact disc read-only memory (CD-ROM), a magnetic tape, a floppy disk, an optical data storage device, and the like.

In addition, an exemplary embodiment of the present disclosure further provides a computer program product, including a computer program or computer instructions, the computer program or the computer instructions being loaded and executed by a processor to cause a computer to implement the QEC decoding method.

In the description of the embodiments, the rotated surface code is used as an example, but the technical solution of the present disclosure may be extended to other surface codes with a boundary, and extended to other topological QEC codes, including, but not limited to, a high dimensional toric code, a hyperbolic code, a color code, and the like. However, during use of other topological QEC codes, a technology, such as one-shot or flag qubit, may need to be used during syndrome measurement (parity check), which increases complexity of the solution, and may degrade error correction performance. In addition, a superconducting QC platform is used as an example in the embodiments, but due to the general purpose of the algorithm, the present disclosure can also be applied to any physical QC platform using topological QEC codes.

In addition, when a method, such as winding holes, is used to implement a Clifford gate for QC, the technical solution of the present disclosure can also be applied after modification. When a lattice surgery scheme is used to implement logical quantum gates, the technical solution of the present disclosure can also be applied after modification. Since the present disclosure can be applied to error correction for implementing logical Clifford gates, the present disclosure can also be applied to magic state distillation. In this way, the control system of the present disclosure may perform real-time feedback QEC for general FTQC using topological QEC codes.

The term "plurality" or "a plurality" refers to two or more. And/or describes an association relationship for describing associated objects and represents that three relationships may exist. For example, A and/or B may represent the following three embodiments: Only A exists, both A and B exist, and only B exists. The character "/" generally indicates an "or" relationship between the associated objects. In addition, the step numbers described in the present disclosure merely schematically show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure. This is not limited in the embodiments of the present disclosure.

The term unit (and other similar terms such as subunit, module, submodule, etc.) in this disclosure may refer to a software unit, a hardware unit, or a combination thereof. A software unit (e.g., computer program) may be developed using a computer programming language. A hardware unit may be implemented using processing circuitry and/or memory. Each unit can be implemented using one or more processors (or processors and memory). Likewise, a processor (or processors and memory) can be used to implement one or more units. Moreover, each unit can be part of an overall unit that includes the functionalities of the unit.

The descriptions are merely exemplary embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A quantum error correction (QEC) decoding system, comprising an error correction chip, wherein the error correction chip is configured to:
obtain error syndrome information of a quantum circuit, the error syndrome information being a data array formed by eigenvalues of a stabilizer generator of a QEC code; and
decode the error syndrome information by running neural network decoders, to obtain error result information, the error result information being used for determining a qubit in which an error occurs in the quantum circuit and a corresponding error type, and a core operation of the neural network decoders being a multiply accumulate (MA) operation of unsigned fixed-point numbers obtained through numerical quantization.

2. The QEC decoding system according to claim 1, wherein the neural network decoder comprises at least one hidden layer, wherein an output parameter of the hidden layer is calculated by:
obtaining a quantized weight vector and a quantized input vector, the quantized weight vector comprising a weight parameter in a form of an unsigned fixed-point number obtained through numerical quantization, and the quantized input vector comprising an input parameter in the form of an unsigned fixed-point number obtained through numerical quantization; and
obtaining an output parameter in the form of an unsigned fixed-point number based on an inner product of the quantized weight vector and the quantized input vector.

3. The QEC decoding system according to claim 2, wherein obtaining the output parameter comprises:
obtaining predetermined parameters from on-chip memories of the error correction chips, the predetermined parameters being parameters of which values are not affected by the input parameter; and
obtaining the output parameter in the form of an unsigned fixed-point number based on the predetermined parameters as well as the inner product of the quantized weight vector and the quantized input vector.

4. The QEC decoding system according to claim 3, wherein obtaining the output parameter comprises:
calculating the output parameter $O_q$ in the form of an unsigned fixed-point number according to the following formula:

$$O_q = \underbrace{\frac{scale_w scale_a}{scale_O}}_{S_1}\left(\underbrace{\sum_i q_w[i]q_a[i]}_{A} - \underbrace{w_0 \sum_i q_a[i]}_{B}\right) + \underbrace{\frac{scale_b}{scale_O}(q_b - b_0)}_{S_2}$$

$q_w$ being the weight parameter in the form of an unsigned fixed-point number obtained through numerical quantization, $q_a$ being the input parameter in the form of an unsigned fixed-point number obtained through numerical quantization, $q_b$ being a bias parameter in the form of an unsigned fixed-point number obtained through numerical quantization, $scale_w$ being a scaling coefficient corresponding to the weight parameter, $scale_a$ being a scaling coefficient corresponding to the input parameter, $scale_O$ being a scaling coefficient corresponding to the output parameter, $scale_b$ being a scaling coefficient corresponding to the bias parameter, $w_0$ being a reference fixed-point number corresponding to the weight parameter, $b_0$ being a reference fixed-point number corresponding to the bias parameter, and $i$ being a positive integer; and the predetermined parameters comprise $S_1$, $S_2$, and $w_0$.

5. The QEC decoding system according to claim 2, further comprising: an activation function layer, wherein the activation function layer is configured to perform:
obtaining a sign bit of the output parameter;
maintaining values of bits of the output parameter unchanged in response to determining that the sign bit indicates that the output parameter is a positive number; and
setting the values of the bits of the output parameter to zero in response to determining that the sign bit indicates that the output parameter is a negative number.

6. The QEC decoding system according to claim 1, wherein the QEC decoding system is obtained through normalization, and the normalization includes one or more of:
the neural network decoders run on the plurality of error correction chips have the same network structure;
the hidden layer of the neural network decoder comprises only a convolutional layer and a fully connected layer;
an activation function of the neural network decoder is a rectified linear unit (ReLU) activation function;
each of the error correction chips runs one of the neural network decoders; and
the neural network decoder is adapted to error correction decoding of different quantum circuits.

7. The QEC decoding system according to claim 1, wherein the error correction chip comprises an on-chip memory, a control unit, and an arithmetic module, and wherein
the on-chip memory is configured to store parameter information of the neural network decoder,
the control unit is configured to control the arithmetic module to read the parameter information from the on-chip memory, and
the arithmetic module is configured to read the parameter information from the on-chip memory, execute the MA operation based on the parameter information, and calculate an output parameter of a hidden layer of the neural network decoder based on a result of the MA operation.

8. The QEC decoding system according to claim 7, wherein the arithmetic module is configured to perform:
reading the parameter information from the on-chip memory;

executing the MA operation based on the parameter information; and calculating the output parameter of the hidden layer of the neural network decoder based on the result of the MA operation.

9. The QEC decoding system according to claim 1, wherein a scale of the QEC code is L, and a quantity of the neural network decoders is $(L^2-1)/N+2$, one neural network decoder being configured to determine, based on error syndrome information corresponding to an X error, whether the X error occurs;

one neural network decoder being configured to determine, based on error syndrome information corresponding to a Z error, whether the Z error occurs;

the error syndrome information corresponding to the X error being divided into $(L^2-1)/2N$ groups, each group comprising N syndrome bits, the syndrome bits of each group being decoded by using one neural network decoder to obtain location information of a qubit in which the X error occurs; and the error syndrome information corresponding to the Z error being divided into $(L^2-1)/2N$ groups, each group comprising N syndrome bits, the syndrome bits of each group being decoded by using one neural network decoder to obtain location information of a qubit in which the Z error occurs.

10. A fault-tolerant quantum error correction (FTQEC) system, comprising: a quantum circuit, a quantum control processor (QCP), an arbitrary waveform generator (AWG), a digital acquisition (DAQ) unit, and a quantum error correction (QEC) decoding system including an error correction chip, the AWG being configured to transmit a measurement waveform for error syndrome measurement to the quantum circuit, the DAQ unit being configured to acquire the measurement waveform amplified by the quantum circuit, demodulate the acquired measurement waveform to obtain error syndrome information of the quantum circuit, and transmit the error syndrome information to the QCP, the error syndrome information being a data array formed by eigenvalues of a stabilizer generator of a QEC code, the QCP being configured to transmit the error syndrome information to the plurality of error correction chips in the QEC decoding system, and the error correction chip being configured to decode the error syndrome information by running neural network decoders, to obtain error result information, the error result information being used for determining a qubit in which an error occurs in the quantum circuit and a corresponding error type, and a core operation of the neural network decoders being a multiply accumulate (MA) operation of unsigned fixed-point numbers obtained through numerical quantization.

11. The FTQEC system according to claim 10, wherein the error correction chip is further configured to transmit the error result information to the QCP, the QCP is further configured to transmit an error correction instruction to the AWG based on the error result information, the error correction instruction comprising location information of the qubit in which the error occurs and the corresponding error type, and the AWG is further configured to transmit an error correction waveform to the quantum circuit based on the error correction instruction, the error correction waveform being used for correcting the qubit in which the error occurs in the quantum circuit.

12. The FTQEC system according to claim 10, wherein low-voltage differential signaling (LVDS) is included in one or more of:

communication between the QCP and the AWG;
communication between the QCP and the DAQ unit; and
communication between the QCP and the error correction chips.

13. The FTQEC system according to claim 10, wherein the neural network decoder includes at least one hidden layer, wherein an output parameter of the hidden layer is calculated by:

obtaining a quantized weight vector and a quantized input vector, the quantized weight vector comprising a weight parameter in a form of an unsigned fixed-point number obtained through numerical quantization, and the quantized input vector comprising an input parameter in the form of an unsigned fixed-point number obtained through numerical quantization; and obtaining an output parameter in the form of an unsigned fixed-point number based on an inner product of the quantized weight vector and the quantized input vector.

14. A quantum error correction (QEC) decoding method, applied to a QEC decoding system, the QEC decoding system including an error correction chip, the method comprising:

obtaining error syndrome information of a quantum circuit, the error syndrome information being a data array formed by eigenvalues of a stabilizer generator of a QEC code; and decoding the error syndrome information by running neural network decoders, to obtain error result information, the error result information being used for determining a qubit in which an error occurs in the quantum circuit and a corresponding error type, and a core operation of the neural network decoders being a multiply accumulate (MA) operation of unsigned fixed-point numbers obtained through numerical quantization.

15. The quantum error correction (QEC) decoding method according to claim 14, wherein the neural network decoder includes at least one hidden layer, and an output parameter of the hidden layer is calculated by:

obtaining a quantized weight vector and a quantized input vector, the quantized weight vector comprising a weight parameter in a form of an unsigned fixed-point number obtained through numerical quantization, and the quantized input vector comprising an input parameter in the form of an unsigned fixed-point number obtained through numerical quantization; and obtaining an output parameter in the form of an unsigned fixed-point number based on an inner product of the quantized weight vector and the quantized input vector.

16. The quantum error correction (QEC) decoding method according to claim 15, wherein obtaining the output parameter comprises:

obtaining predetermined parameters from on-chip memories of the error correction chips, the predetermined parameters being parameters of which values are not affected by the input parameter; and obtaining the output parameter in the form of an unsigned fixed-point number based on the predetermined parameters as well as the inner product of the quantized weight vector and the quantized input vector.

17. The quantum error correction (QEC) decoding method according to claim 15, further comprising:

obtaining a sign bit of the output parameter;

maintaining values of bits of the output parameter unchanged in response to determining that the sign bit indicates that the output parameter is a positive number; and setting the values of the bits of the output parameter to zero in response to determining that the sign bit indicates that the output parameter is a negative number.

18. The quantum error correction (QEC) decoding method according to claim 14, wherein the QEC decoding system is obtained through normalization, and the normalization includes one or more of:

the neural network decoders run on the plurality of error correction chips have the same network structure;

the hidden layer of the neural network decoder comprises only a convolutional layer and a fully connected layer;

an activation function of the neural network decoder is a rectified linear unit (ReLU) activation function;

each of the error correction chips runs one of the neural network decoders; and the neural network decoder is adapted to error correction decoding of different quantum circuits.

19. The quantum error correction (QEC) decoding method according to claim 14, wherein the error correction chip includes an on-chip memory, a control unit, and an arithmetic module, and wherein the on-chip memory is configured to store parameter information of the neural network decoder, the control unit is configured to control the arithmetic module to read the parameter information from the on-chip memory, and the arithmetic module is configured to read the parameter information from the on-chip memory, execute the MA operation based on the parameter information, and calculate an output parameter of a hidden layer of the neural network decoder based on a result of the MA operation.

20. The quantum error correction (QEC) decoding method according to claim 14, wherein the arithmetic module is configured to perform:

reading the parameter information from the on-chip memory;

executing the MA operation based on the parameter information; and calculating the output parameter of the hidden layer of the neural network decoder based on the result of the MA operation.

\* \* \* \* \*